(12) United States Patent
Cho et al.

(10) Patent No.: US 12,501,702 B2
(45) Date of Patent: Dec. 16, 2025

(54) DISPLAY DEVICE

(71) Applicant: Samsung Display Co., Ltd., Yongin-Si (KR)

(72) Inventors: Seung-Hwan Cho, Yongin-si (KR); Sun Ho Kim, Seongnam-si (KR); Tae Woo Kim, Seoul (KR); Seon Beom Ji, Seoul (KR); Jong Hyun Choi, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 83 days.

(21) Appl. No.: 16/998,993

(22) Filed: Aug. 20, 2020

(65) Prior Publication Data

US 2021/0151470 A1 May 20, 2021

(30) Foreign Application Priority Data

Nov. 19, 2019 (KR) ........................ 10-2019-0148746

(51) Int. Cl.
*H10D 86/60* (2025.01)
*H01L 23/58* (2006.01)
(Continued)

(52) U.S. Cl.
CPC ........... *H10D 86/60* (2025.01); *H01L 23/585* (2013.01); *H10D 86/441* (2025.01); *G09G 3/32* (2013.01); *G09G 2310/0202* (2013.01)

(58) Field of Classification Search
CPC ....... H01L 27/124; H01L 23/585; G09G 3/32; G09G 2310/0202
(Continued)

(56) References Cited

U.S. PATENT DOCUMENTS 5,986,648 A 11/1999 Okada et al.
10,748,981 B1 * 8/2020 Rieutort-Louis .... H10K 59/131
(Continued)

FOREIGN PATENT DOCUMENTS

CN 107403825 A 11/2017
CN 108873510 A 11/2018
(Continued)

OTHER PUBLICATIONS

Chinese Office Action corresponding to Application No. 202011291004.1, dated on Mar. 12, 2025, 8 pages.
(Continued)

*Primary Examiner* — Ori Nadav
(74) *Attorney, Agent, or Firm* — Innovation Counsel LLP

(57) ABSTRACT

A display device according to an embodiment of the present inventive concept includes: a substrate that includes a main display portion and first side portions connected with the main display portion; scan lines and data lines that are disposed on the substrate; pixels that are connected with the scan lines and the data lines; data voltage transmission lines that are respectively connected with the data lines; connection wires that are connected with the data voltage transmission lines; sub-connection wires that are connected with the connection wires; and a driver that is connected with the sub-connection wires, wherein the order of alignment of the data line connected with the connection wires and the order of alignment of the sub-connection wires connected with the connection wires are the same.

4 Claims, 22 Drawing Sheets

(51) Int. Cl.
*H10D 86/40* (2025.01)
*G09G 3/32* (2016.01)

(58) Field of Classification Search
USPC .......................................................... 257/773
See application file for complete search history.

(56) References Cited

U.S. PATENT DOCUMENTS

| | | | |
|---|---|---|---|
| 2011/0074743 A1 | 3/2011 | Son et al. | |
| 2011/0248908 A1 | 10/2011 | Chang et al. | |
| 2015/0356937 A1 | 12/2015 | Fujikawa | |
| 2016/0190223 A1* | 6/2016 | Park | H01L 27/3276 257/40 |
| 2016/0291378 A1 | 10/2016 | Li et al. | |
| 2017/0170255 A1 | 6/2017 | Ha et al. | |
| 2017/0228077 A1 | 8/2017 | Abe et al. | |
| 2017/0337873 A1 | 11/2017 | Kim et al. | |
| 2018/0197484 A1 | 7/2018 | Moon et al. | |
| 2018/0331124 A1* | 11/2018 | Cho | H01L 27/1218 |
| 2019/0057632 A1 | 2/2019 | Kim et al. | |
| 2019/0081118 A1* | 3/2019 | Oh | H01L 27/3246 |
| 2019/0206976 A1 | 7/2019 | Jeong et al. | |
| 2019/0207155 A1* | 7/2019 | Lee | H01L 51/56 |
| 2019/0229160 A1 | 7/2019 | Lee et al. | |

FOREIGN PATENT DOCUMENTS

| | | |
|---|---|---|
| CN | 109427273 A | 3/2019 |
| CN | 110071140 A | 7/2019 |
| JP | 2004-271632 A | 9/2004 |
| JP | 2007-026703 A | 2/2007 |
| JP | 2010-175700 A | 8/2010 |
| JP | 2019-124787 A | 7/2019 |
| KR | 10-2011-0033662 A | 3/2011 |
| KR | 10-1217083 B1 | 12/2012 |
| KR | 10-2015-0062356 A | 6/2015 |
| KR | 10-2016-0053243 A | 5/2016 |
| KR | 10-2017-0046748 A | 5/2017 |
| KR | 10-2018-0024687 A | 3/2018 |
| KR | 10-1869101 B1 | 6/2018 |
| KR | 10-2018-0082688 A | 7/2018 |
| KR | 10-2018-0125061 A | 11/2018 |
| KR | 10-2019-0083392 A | 7/2019 |
| KR | 10-2020-0010697 A | 1/2020 |
| WO | 2014-112560 A1 | 7/2014 |
| WO | 2015-024299 A1 | 2/2015 |

OTHER PUBLICATIONS

Chinese Office Action mailed Oct. 22, 2025, issued in related Chinese Application No. 202011291004.1 filed Nov. 18, 2020, 6 pages.

* cited by examiner

DISPLAY DEVICE

CROSS-REFERENCE TO RELATED APPLICATION

This application claims priority to and the benefit of Korean Patent Application No. 10-2019-0148746 filed in the Korean Intellectual Property Office on Nov. 19, 2019, the entire contents of the Korean Patent Application incorporated herein by reference.

BACKGROUND

(a) Technical Field

The technical field relates to a display device.

(b) Description of the Related Art

A variety of mobile electronic devices such as mobile phones, navigation systems, digital cameras, electronic books, portable game machines, and various terminals are in widespread use. These mobile electronic devices may include a liquid crystal display (LCD) or organic light emitting diode (OLED) display.

Such a display device have generally been rectangular, but recently rounded corner portions have been adopted.

In the rounded corner portions, the side surface, and other areas of the display device, a signal line is provided to transmit an image signal, thereby increasing a non-display area and reducing a light emission area. When a signal line is disposed to prevent the decrease of the light emission area, an alignment order of drivers and an alignment order of signal lines become different from each other, and a specific alignment of the drivers is required.

The above information disclosed in this Background section is only for enhancement of understanding of the background of the present inventive concept and therefore it may contain information that does not form the prior art that is already known in this country to a person of ordinary skill in the art.

SUMMARY

Embodiments have been made in an effort to provide a display device that can prevent manufacturing cost from being increased while preventing a light emission area from being reduced.

A display device according to an embodiment of the present inventive concept includes: a substrate that includes a main display portion and first side portions connected with the main display portion; scan lines and data lines that are disposed on the substrate; pixels that are connected with the scan lines and the data lines; data voltage transmission lines that are respectively connected with the data lines; connection wires that are connected with the data voltage transmission lines; sub-connection wires that are connected with the connection wires; and a driver that is connected with the sub-connection wires, wherein an arrangement order of the data lines at the first side portions from leftmost to rightmost and a connection order of the data lines with the driver through the sub-connection wires area same arrangement order.

The display device may have, of the connection wires, a connection wire connected with an n-th data line (n is a positive integer) among the plurality of data lines is connected with an n-th sub-connection wire among the sub-connection wires connected with the driver.

The display device may have second side portions that are bent from the main display portion, wherein the driver is connected with the second side portions.

The display device may have the main display portion comprise a first conductive layer, a second conductive layer, a third conductive layer, and a fourth conductive layer that are insulated from each other, the connection wires comprise at least one of a first connection wire disposed in a same layer as the first conductive layer, a second connection wire disposed in a same layer as the second conductive layer, a third connection wire disposed in a same layer as the third conductive layer, and a fourth connection wire disposed in a same layer as the fourth conductive layer.

The display device may have wherein the data lines and the data voltage transmission lines are connected with each other at one edge of the first side portions.

The display device may have edge portions that are disposed between the main display portion and the first side portions, wherein, when n data lines are disposed between the first side portions and the edge portions, one edge of each of the data voltage transmission lines connected with the n data lines of the first side portion and the edge portion are respectively located between n data lines of the main display portion adjacent to the edge portion.

The display device may have wherein the data lines are connected with a driver through first connection wires, and wherein the data voltage transmission lines are connected with the driver through a first sub-connection wire and fourth connection wires.

The display device may have a contact hole formed in the plurality of insulation layers, wherein insulation layers are disposed between the first sub-connection wire and the fourth connection wires, and wherein the first sub-connection wire and the fourth connection wire are connected through the contact hole.

The display device may have wherein the first connection wires are alternately located one by one.

The display device may have a shield layer that is disposed between the first sub-connection wire and the fourth connection wires and disposed in the same layer as the third conductive layer.

The display device may have wherein the driver comprises a bending portion and a driving circuit portion, wherein the bending portion is disposed between at least one of the second side portions and the driving circuit portion, and wherein the fourth connection wire is disposed between the bending portion and the driving circuit portion.

The display device may have wherein the driver comprises a bending portion and a driving circuit portion, wherein the bending portion is disposed between the second side portion and the driving circuit portion, and wherein the fourth connection wires are disposed between the second side portion and the bending portion.

A display device according to an embodiment includes: a substrate that includes a main display portion and first side portions connected with the main display portion; scan lines and a data lines that are disposed on the substrate; pixels that are connected with the scan lines and the data lines; data voltage transmission lines that are respectively connected with the data lines; connection wires that are connected with the data voltage transmission lines; and a driver that is connected with the connection wires.

The display device may have wherein the connection wires comprise a third connection wire and a fourth connection wire, wherein n data lines (n is a positive integer) of the main display portion are connected with the driver through the third connection wire, and wherein the data voltage transmission line is connected with the driver through the third connection wire and the fourth connection wire.

The display device may have wherein an insulation layer is disposed between the third connection wire and the fourth connection wire, wherein the insulation layer comprises a contact hole, and wherein the third connection wire and the fourth connection wire contact each other through the contact hole.

The display device may have wherein the driver comprises a bending portion and a driving circuit portion, wherein the bending portion is disposed between the second side portion and the driving circuit portion, and wherein the fourth connection wire is disposed in the bending portion.

The display device may have wherein the connection wires comprise a third connection wire and a fifth connection wire, wherein n data lines (n is a positive integer) of the main display portion are connected with a driver through the third connection wire, wherein the data voltage transmission lines are connected with the driver through the third connection wire and the fifth connection wire, and wherein the display device further comprises a shield layer that is disposed in the same layer as a fourth conductive layer, while being disposed between the third connection wire and a fifth connection wire.

The display device may have second side portions that are bent from the main display portion, wherein the driver comprises a bending portion and a driving circuit portion, wherein the bending portion is disposed between the second side portion and the driving circuit portion, and wherein the fifth connection wire is disposed in the bending portion.

The display device may have wherein the connection wires comprise a first connection wire, a second connection wire, and a fourth connection wire, wherein n data lines of the main display portion are connected with a driver through the first connection wire or the second connection wire, and wherein the data voltage transmission line is connected with the driver through the fourth connection wire.

The display device may have wherein at least one of the first connection wire, the second connection wire and the fourth connection wire cross another one of the first connection wire, the second connection wire and the fourth connection wire, with an insulation layer disposed therebetween.

The display device may have a shield layer that is disposed in a same layer as a third conductive layer and is between at least two of the first connection wire, the second connection wire, and the fourth connection wire.

The display device may have wherein the driver comprises a bending portion and a driving circuit portion, wherein the bending portion is disposed between the second side portion and the driving circuit portion, and wherein the fourth connection wire is disposed between the second side portion and the bending portion.

The display device may have comprising second side portions that are bent from the main display portion, wherein the driver comprises a bending portion and a driving circuit portion, wherein the bending portion is disposed between the second side portion and the driving circuit portion, and wherein the fourth connection wire is disposed between the bending portion and the driving circuit portion.

The display device may have wherein the connection wires comprise a first connection wire, a second connection wire, and a fourth connection wire, wherein the driver comprises a chip on film, wherein n data lines of the main display portion are connected with the chip on film through the first connection wire or the second connection wire, and wherein the data voltage transmission lines are connected with the chip on film through the fourth connection wire.

A display device according to an embodiment includes: a substrate that comprises a main display portion and first side portions connected with the main display portion; scan lines and data lines that are disposed on the substrate; pixels that are connected with the scan lines and the data lines; data voltage transmission lines that are connected with the data lines; connection wires that are connected with the data voltage transmission lines; sub-connection wires that are connected with the connection wires; and a driver that is connected with the sub-connection wires, wherein the data line and the data voltage transmission line are connected with each other at one edge of the first side portion.

The display device may have wherein an arrangement order of the data lines at the first side portions from leftmost to rightmost and a connection order of the data lines with the driver through the sub-connection wires area are a same arrangement order.

The display device may have wherein a connection wire connected with an n-th data line (n is a positive integer) among the data lines is connected with an n-th sub-connection wires among the sub-connection wires connected with the driver.

The display device may have wherein the main display portion comprises a first conductive layer, a second conductive layer, a third conductive layer, and a fourth conductive layer that are insulated from each other, and wherein the connection wires comprise one or more of a first connection wire disposed in a same layer as the first conductive layer, a second connection wire disposed in a same layer as the second conductive layer, a third connection wire disposed in a same layer as the third conductive layer, and a fourth connection wire disposed in a same layer as the fourth conductive layer.

The display device may have comprising second side portions bent from the main display portion, wherein the driver is connected to the second side portions.

The display device may have wherein the driver comprises a bending portion and a driving circuit portion, and wherein the bending portion is disposed between the second side portion and the driving circuit portion.

According to the embodiments, the arrangement order of the data lines and the connection order of the drivers are made to be the same such that reduction of the light emission area can be prevented, and manufacturing cost increase of the driver can be prevented.

DETAILED DESCRIPTION OF THE EMBODIMENTS

Figure 1:
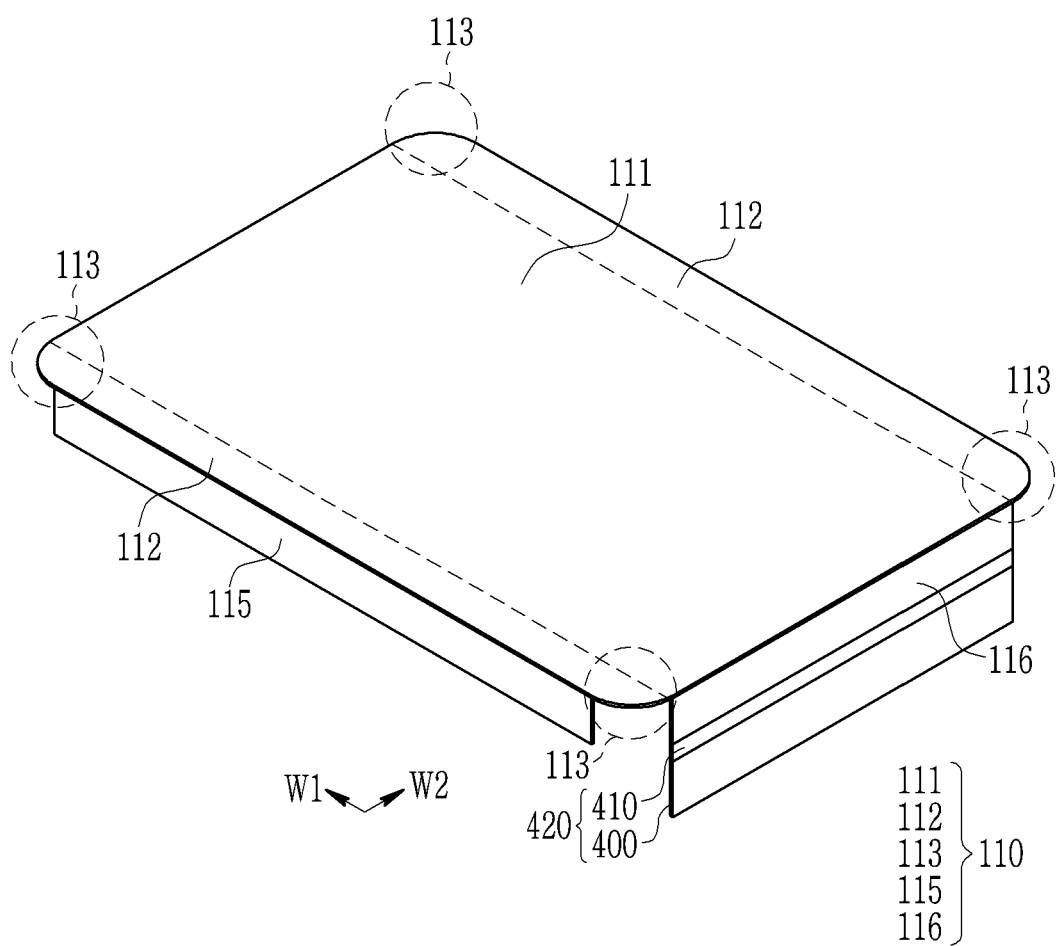
FIG. 1 is a perspective view of a display device according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive. Like reference numerals may designate like elements throughout the specification.

Sizes of elements in the drawings may be exaggerated for convenience of explanation. When an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Hereinafter, a display device according to an embodiment of the present inventive concept will be described with reference to the accompanying drawings.

The terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

The singular forms "a," "an," and "the" may include the plural forms as well, unless the context clearly indicates otherwise.

Although the terms "first," "second," etc. may be used to describe various elements, these elements should not be limited by these terms. These terms are used to distinguish one element from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

First, referring to FIG. 1 to FIG. 3, a display device according to an embodiment will be described. FIG. 1 is a perspective view of a display device according to an embodiment, and FIG. 2 is a developed diagram of the display device shown in FIG. 1.

Figure 2:
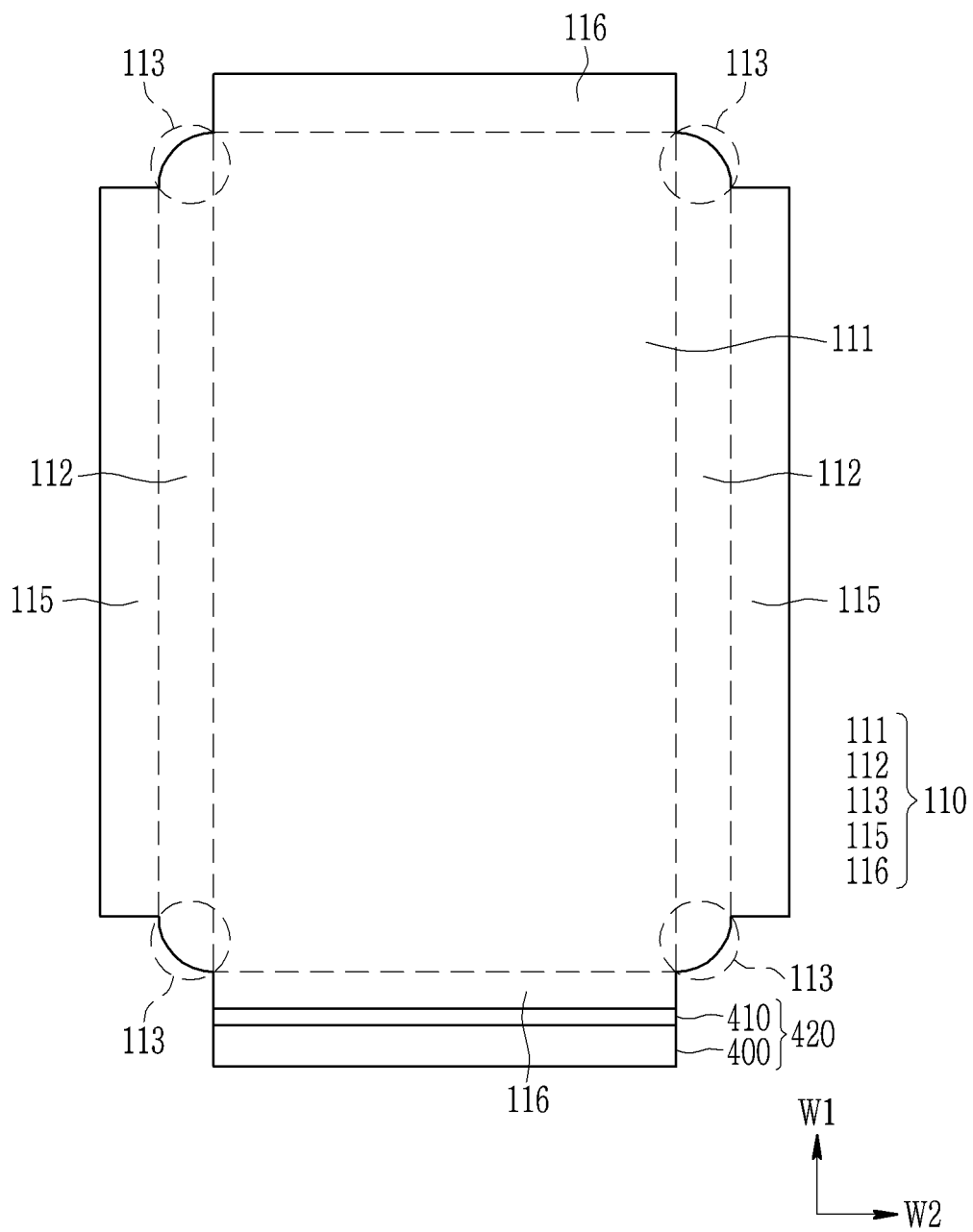
FIG. 2 is a plan view of the display device shown in FIG. 1.

As shown in FIG. 1 and FIG. 2, a display device according to an embodiment includes a substrate 110 that includes a main display portion 111, an edge portion 112 located at an edge of the main display portion 111, a first side portion 115 bent from the edge portion 112, and a second side portion 116 bent from the main display portion 111. The main display portion 111, the edge portion 112, the first side portion 115, and the second side portion 116 may be included in a display portion.

The main display portion 111 is located at a center portion of the substrate 110, and may be formed in the shape of a polygon. The main display portion 111 may be formed in the shape of a quadrangle. The main display portion 111 may be formed in the shape of a rectangle including two sides extending in a first direction W and two sides extending in a second direction W2. A length of the two sides extending in the first direction W1 may be longer than a length of the two sides extending in the second direction W2.

The edge portion 112 is located at opposite edges of the main display portion 111. The edge portions 112 may be located at the left edge and the right edge of the main display portion 111. The edge portion 112 extends in the first direction W1.

The edge portion 112 may include corner portions 113. In FIG. 1, the corner portions 113 are rounded, but the corner portions 113 may be formed to be the right-angle corners of a quadrangle instead of being rounded.

The first side portions 115 are bent from the edge portions 112. In this case, the first side portion 115 extends from a portion of the edge portion 112, excluding the corner portion 113. Thus, a side surface is not formed in a portion where the corner portion 113 is located. The first side portions 115 extend in the first direction W1.

Depending on embodiments, the edge portions 112 may be omitted. In this case, the first side portions 115 may be bent from the main display portion 111. The second side portion 116 is bent from the main display portion 111. The second side portions 116 may be bent from the upper edge and the lower edge of the main display portion 111. In an embodiment, the edge portions 112 may be located at the upper edge and the lower edge of the main display portion 111. In this case, the second side portions 116 may be bent from the left edge and the right edge of the main display portion 111. The second side portions 116 extend in the second direction W2.

The second side portion 116 is connected with a driver 420, and may be directly connected with the driver 420. The driver 420 includes a driving circuit portion 400 and a bending portion 410. That is, the driver 420 may be hardware including a circuit. The bending portion 410 is disposed between the second side portion 116 and the driving circuit portion 400. The driver 420 is bent in the bending portion 410, and the driving circuit portion 400 may be located at a rear side of the main display portion 111. Depending on embodiments, the bending portion 410 may be omitted.

In FIG. 1 and FIG. 2, the driver 420 may be provided as a chip on film (COF).

Figure 3:
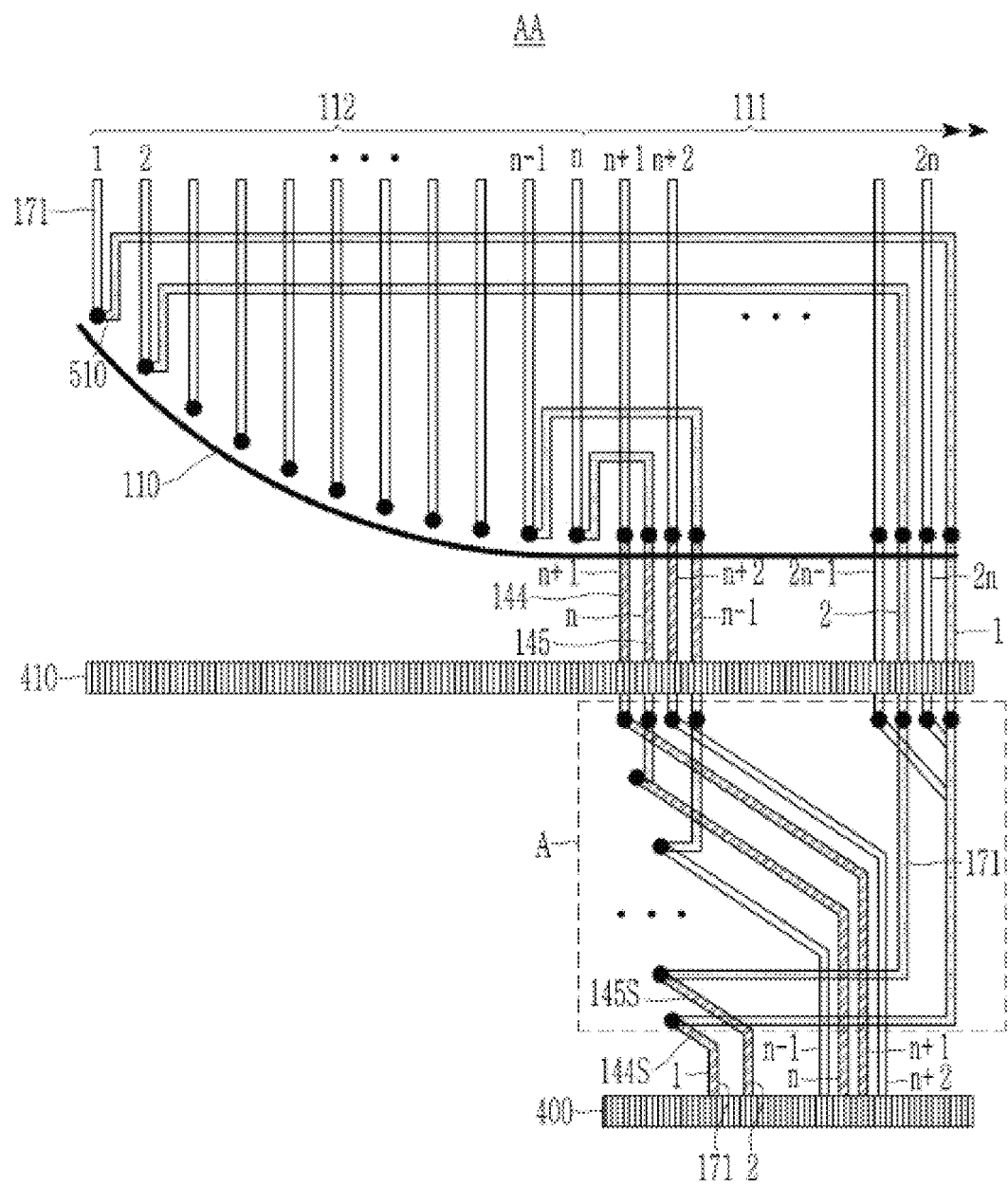
FIG. 3 illustrates a connection between wires located in the first side portion and the edge portion in the substrate and the driving circuit portion.

FIG. 3 illustrates a connection between wires located in the edge portion 112 and the main display portion 111 in the substrate 110, and the driving circuit portion 400. Hereinafter, the edge portion 112 and the main display portion 111 near the corner portion 113 may be referred to as an auxiliary display portion AA.

A plurality of data lines 171 are located in the substrate 110 of the auxiliary display portion AA. The data lines 171 are connected with the driving circuit portion 400 through data voltage transmission lines 510. In the figures, portions where wires contact each other are denoted by dark circles, like the contact areas of the data lines 171 and the data voltage transmission lines 510. The bending portion 410 is disposed between the driving circuit portion 400 and the substrate 110.

In FIG. 3, each data line 171 is numbered. Referring to FIG. 3, the plurality of data lines 171 are illustrated in the order of 1, 2, . . . , n, . . . , and 2n in the substrate 110 of the auxiliary display portion AA. That is, the order of the data lines has 1 on the leftmost of the display portion AA and 2n at the rightmost of the display portion AA. However, the order of connecting to the bending portion 410 through the data voltage transmission line 510 is different from the order in which the data lines 171 are arranged in a display area. The sequence is shown near the wires.

In order to connect the data lines 171 located in the first side portion 115 and the edge portion 112 with the driving circuit portion 400, the data voltage transmission lines 510 are required. In a comparative example, in order for the arrangement order of the data lines to be the same as the order of the data voltage transmission lines connected with the driving circuit portion, the contact areas of the data lines and the data voltage transmission lines considerably overlap the first side portions and the edge portions.

That is, in a comparative example, when the first data line of the data lines contacts the data voltage transmission line at one edge, the second data line of the data lines needs to contact the data voltage transmission line at a higher area than the contact area. When n data lines sequentially contact the respective data voltage transmission lines, n contact areas are required, and such contact areas overlap the display area. When the data line and the data voltage transmission line contact in the display area, the contact area may be viewed as a diagonal line staining the display area when the display device is driven.

However, referring to FIG. 3, the data lines 171 and the data voltage transmission lines 510 located in the first side portions 115 and the edge portions 112 contact each other in edges of the display portion. That is, the data lines 171 and the data voltage transmission lines 510 contact each other at edges of the first side portions 115 and the edge portions 112 without being overlapped with the display area, thereby preventing occurrence of diagonal stains.

Figure 4:
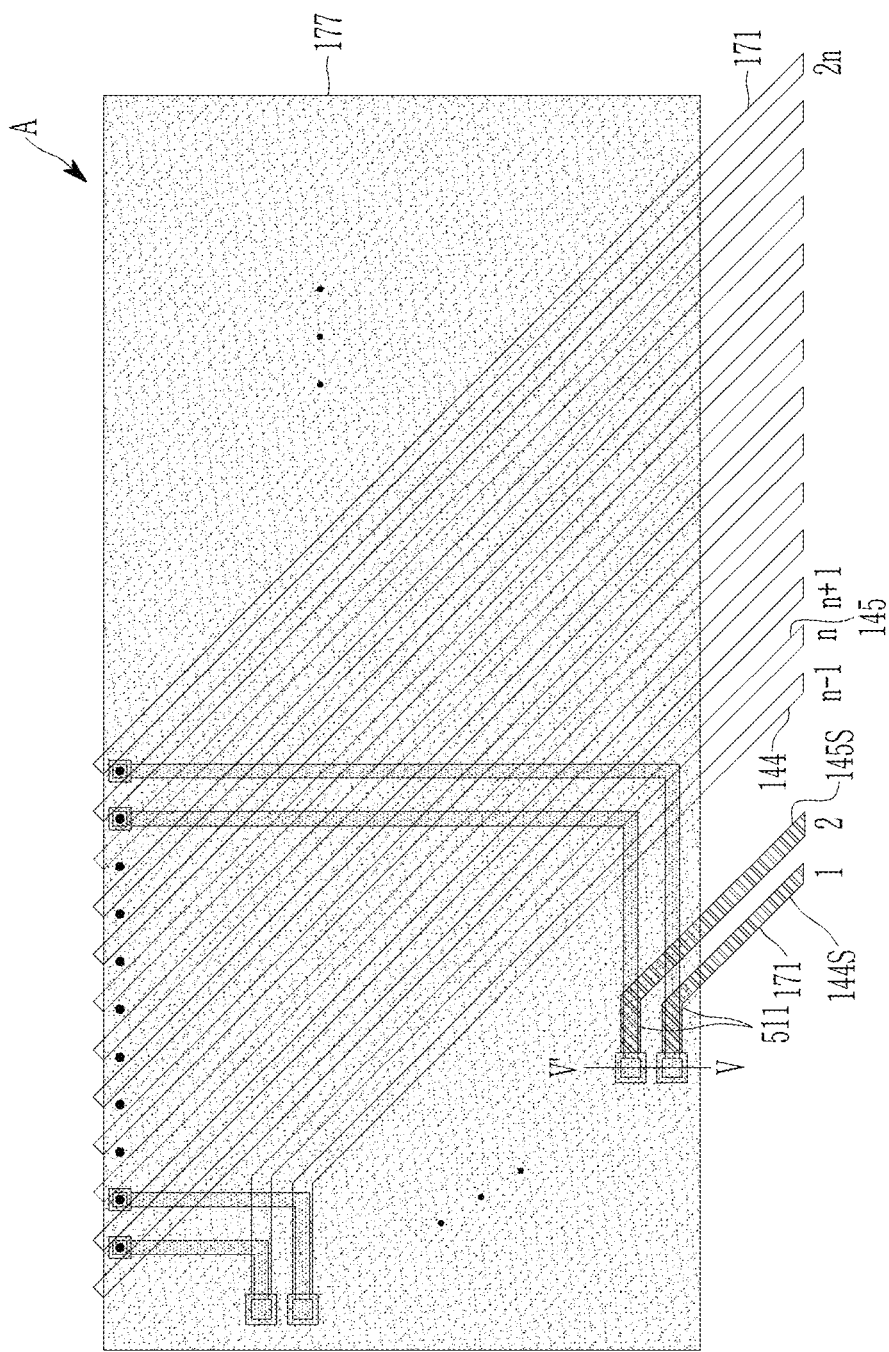
FIG. 4 is an enlarged view the area A in FIG. 3.

As shown in FIG. 3 and FIG. 4, when the data lines 171 and the data voltage transmission lines 510 contact each other at an edge of the substrate 110, the initial arrangement order of the data lines 171 and the order of connecting with the bending portion 410 become different from each other. This is because the data voltage transmission lines 510 are alternately connected with the data lines 171 one by one.

Since the alignment order of the data lines 171 and the order of connecting the data voltage transmission lines 510 to the driving circuit portion 410 are different from each other, the driving circuit portion 400 would also need to change the signal order of each wire, thereby causing a manufacturing cost increase of the display device.

However, referring to FIG. 3 and FIG. 4, in the display device according to the present embodiment, the data voltage transmission lines 510 and the bending portion 410 are connected with each other through a first connection wire 144 and a second connection wire 145. Then, the bending portion 410 and the driving circuit portion 400 may be connected with each other through a first sub-connection wire 144S, a second sub-connection wire 145S, and fourth connection wires 511. The data lines 171 are connected to the driving circuit portion 400 in the same order as they are arranged. That is, the first data line of data lines 171, which is the leftmost data line 171 of the auxiliary display portion AA as illustrated in FIG. 3, is also the leftmost connection of the driving circuit portion 400 out of all the data lines connected with driving circuit portion 400. Thus, there is no need to change the signal order of the driving circuit portion 400, thereby preventing an increase of the manufacturing cost and preventing occurrence of diagonal stains.

The connection wires may be located in various layers. For example, the connection wires may be located on the same layer as one of what is referred to as a first conductive layer, a second conductive layer, a third conductive layer, and a fourth conductive layer of the display area DA. Hereinafter, a wire disposed in the same layer as the first conductive layer of the display area DA will be referred to as a first connection wire 144, a wire disposed in the same layer as the second conductive layer will be referred to as a second connection wire 145, a wire disposed in the same layer as the third conductive layer will be referred to as a third connection wire 178, and a wire disposed in the same layer as the fourth conductive layer will be referred to as a fourth connection wire 511.

The first conductive layer, the second conductive layer, the third conductive layer, and the fourth conductive layer of the display area DA will be described in detail later.

Referring back to FIG. 3 and FIG. 4, the connection wires of the display device according to the present embodiment include the first connection wire 144, the second connection wire 145, and the fourth connection wires 511. In addition, sub-connection wires may include a first sub-connection wire 144S and a second sub-connection wire 145S.

The first connection wire 144 and the first sub-connection wire 144S may be on the same layer as (i.e., level with) the first conductive layer of the display area DA, and the second connection wire 145 may be on the same layer as the second conductive layer of the display area DA. In addition, the fourth connection wires 511 may be on the same layer as the data voltage transmission line 510, and may be on the same layer as the fourth conductive layer of the display area DA.

Figure 5:
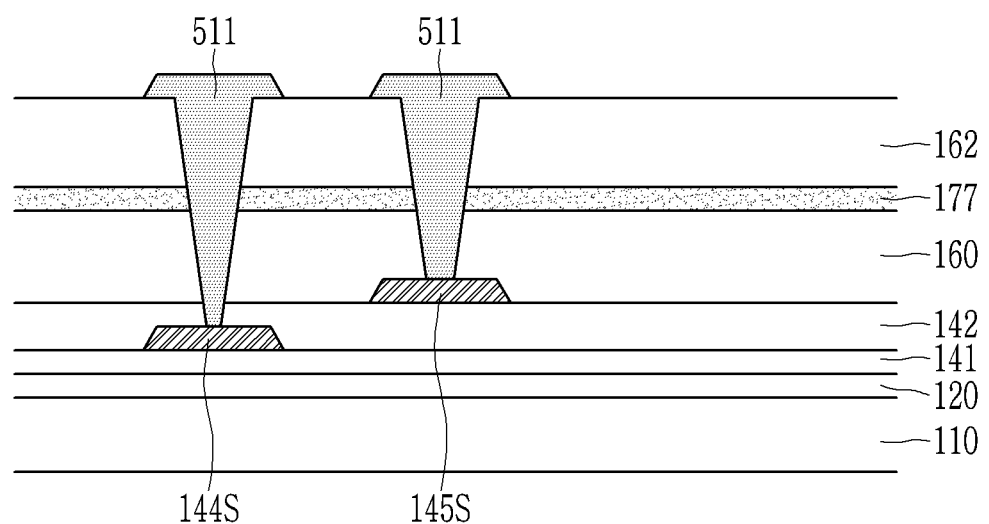
FIG. 5 is a cross-sectional view of FIG. 4, taken along the line V-V'.

FIG. 4 separately shows the area marked as A in FIG. 3. FIG. 5 is a cross-sectional view of FIG. 4, taken along the line V-V'. Referring to FIG. 4, the first connection wire 144 on the same layer as the first conductive layer and the second connection wire 145 on the same layer as the second conductive layer are alternately arranged. Referring to FIG. 4, when n data lines are located in the first side portions 115 and the edge portions 112, each of the n data lines is connected with the first connection wire 144 and the second connection wire 145 through the fourth connection wires 511. That is, the first data line of the data lines 171 is connected to the first sub-connection wire 144S through the fourth connection wire 511, and the second data line of the data lines 171 is connected to the first second sub-connection wire 145S through the fourth connection wire 511. The n wires located at the first side portion 115 and the edge portions 112 are connected with the first sub-connection wire 144S and the second sub-connection wires 145S through the fourth connection wires 511, and from an (n+1)th wire to a 2n-th wire are directly connected to the first sub-connection wire 144S and the second sub-connection wire 145S without through the fourth connection wires 511. Accordingly, the alignment order of the data lines 171 and the signal order of the driving circuit portion 400 become equal to each other in the display area DA.

Since the first sub-connection wire 144S and the second sub-connection wire 145S are alternately arranged, a gap between wires can be narrowed. In embodiments of the present inventive concept, only one of the first sub-connection wire 144S and the second sub-connection wire 145S may be used.

FIG. 5 is a cross-sectional view of FIG. 4, taken along the line V-V'. Referring to FIG. 5, a buffer layer 120 is located on the substrate 110. A first insulation layer 141 is located in the buffer layer 120. The first sub-connection wire 144S is located on the first insulation layer 141. The first sub-connection wire 144S is located in the first conductive layer of the display area DA.

Next, a second insulation layer 142 is located on the first sub-connection wire 144S. Next, the second sub-connection wire 145S is located, and the second sub-connection wire 145S is located on the same layer as the second conductive layer of the display area DA.

A shield layer 177 is located on the third insulation layer 160. The shield layer 177 is on the same layer as the third conductive layer of the display area DA. The shield layer 177 may prevent capacitance between the connection wires. A fourth insulation layer 162 is located on the shield layer 177.

The fourth connection wire 511 is located on the fourth insulation layer 162. The fourth connection wire 511 is located on the same layer as the fourth conductive layer of the display area DA. The fourth connection wire 511 may be electrically connected with the first sub-connection wire 144S and the second sub-connection wire 145S through a contact hole disposed in the second insulation layer 142, the third insulation layer 160, the shield layer 177, and the fourth insulation layer 162. In embodiments, the shield layer 177 may be omitted.

In the embodiment of FIG. 3, the first sub-connection wire 144S, the second sub-connection wire 145S, and the fourth connection wire 511 are disposed between the bending portion 410 and the driving circuit portion 400.

Figure 6:
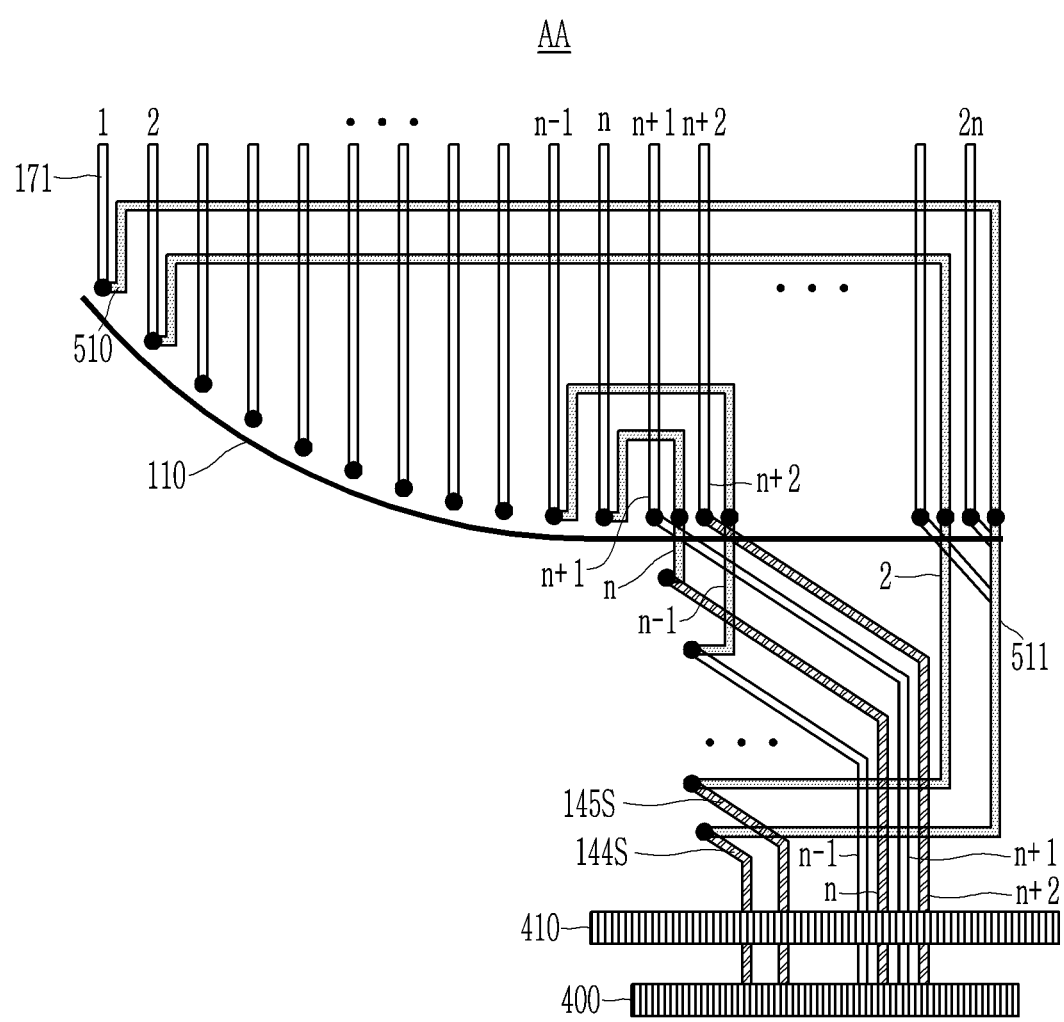
FIG. 6 illustrates a display device according to an embodiment.

FIG. 6 illustrates a display device according to an embodiment. In the display device as illustrated in FIG. 6, the first connection wire 144, the second connection wire 145, and the fourth connection wire 511 are disposed between a display area DA and a bending portion 410.

Figure 7:
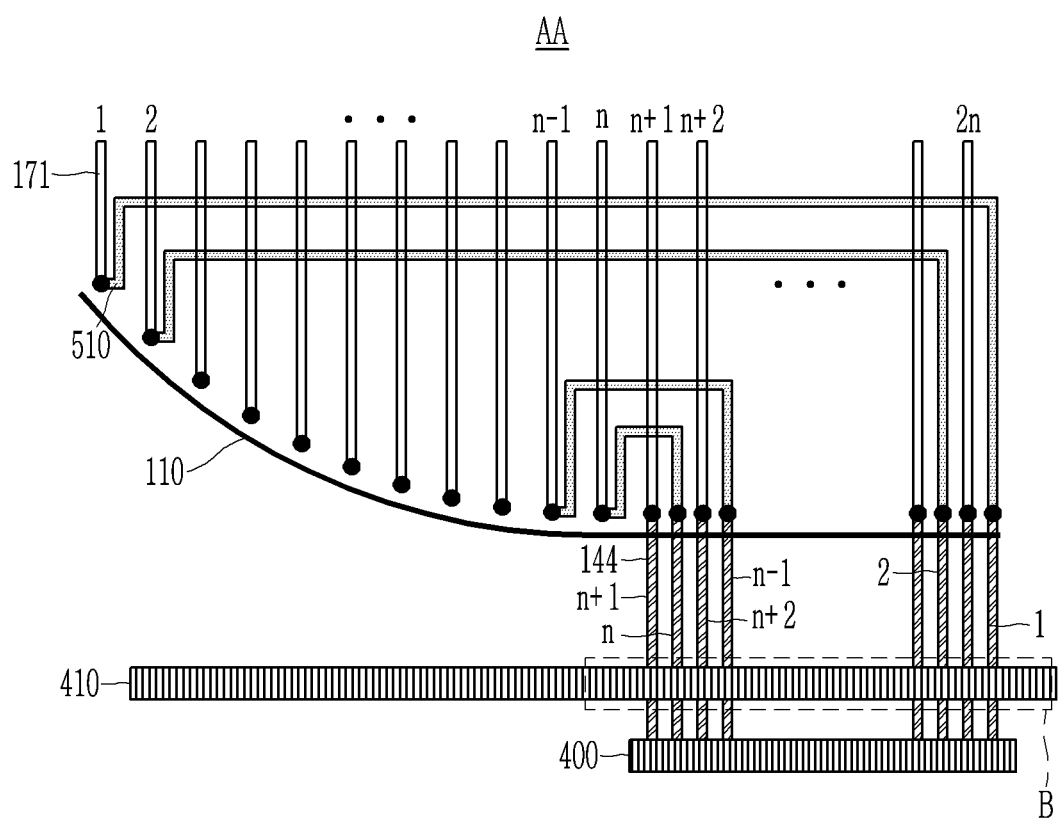
FIG. 7 illustrates a display device according to an embodiment.
Figure 8:
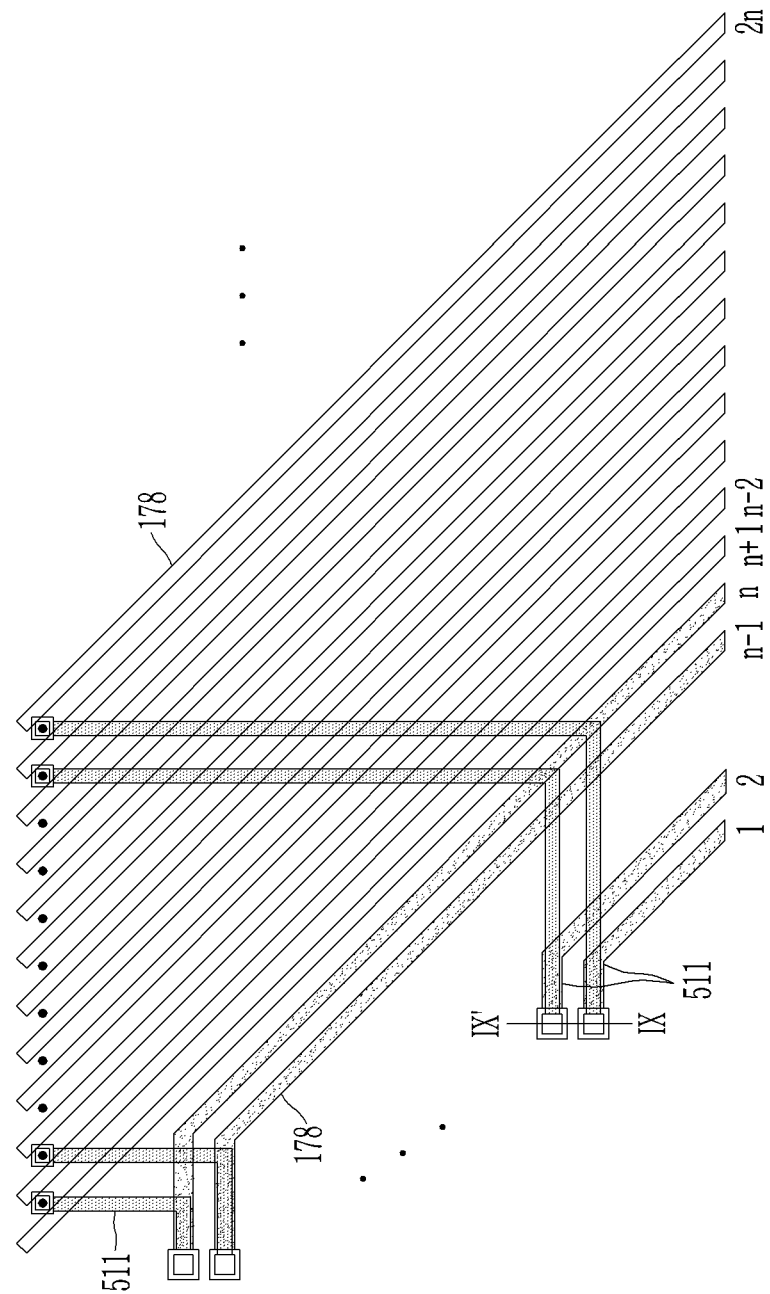
FIG. 8 is an enlarged view of the area A in FIG. 7.

FIG. 7 illustrates a display device according to an embodiment. FIG. 7 illustrates data voltage transmission lines 510 connected with first connection wires 144. FIG. 8 is an enlarged view of the area A in FIG. 7.

Referring to FIG. 8, the display device according to the present embodiment includes third connection wires 178 that are on the same layer as a third conductive layer of a display area DA.

When n data lines are located in first side portions 115 and edge portions 112, each of the n data lines is connected with the third connection wires 178 through fourth connection wires 511. That is, the first data line of the data lines 171 is connected with the first of the third connection wire 178 through the fourth connection wire 511, and the second data line of the data lines 171 is connected with the second of the third connection wires 178 through the fourth connection wire 511. An (n+1)th wire to a 2n-th wire are directly connected with the third connection wires 178 without the fourth connection wires 511. Thus, the alignment order of the data lines 171 and the signal order of the driving circuit portion 400 may be set to be equal to each other in the data area DA.

Figure 9:
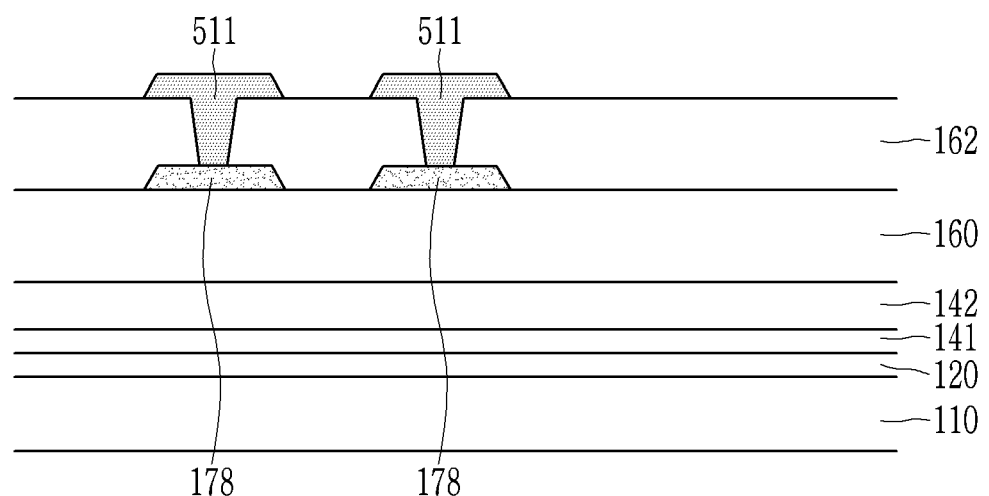
FIG. 9 is a cross-sectional view of FIG. 8, taken along the line IX-IX'.

FIG. 9 is a cross-sectional view of FIG. 8, taken along the line IX-IX'. Referring to FIG. 9, a buffer layer 120, a first insulation layer 141, a second insulation layer 142, and a third insulation layer 160 are sequentially located on a substrate 110.

The third connection wire 178 is located on the third insulation layer 160.

A fourth insulation layer 162 is located on the third connection wire 178. A fourth connection wire 511 is located on the fourth insulation layer 162.

The fourth connection wire 511 and the third connection wire 178 are connected with each other through a contact hole of the fourth insulation layer 162.

Figure 10:
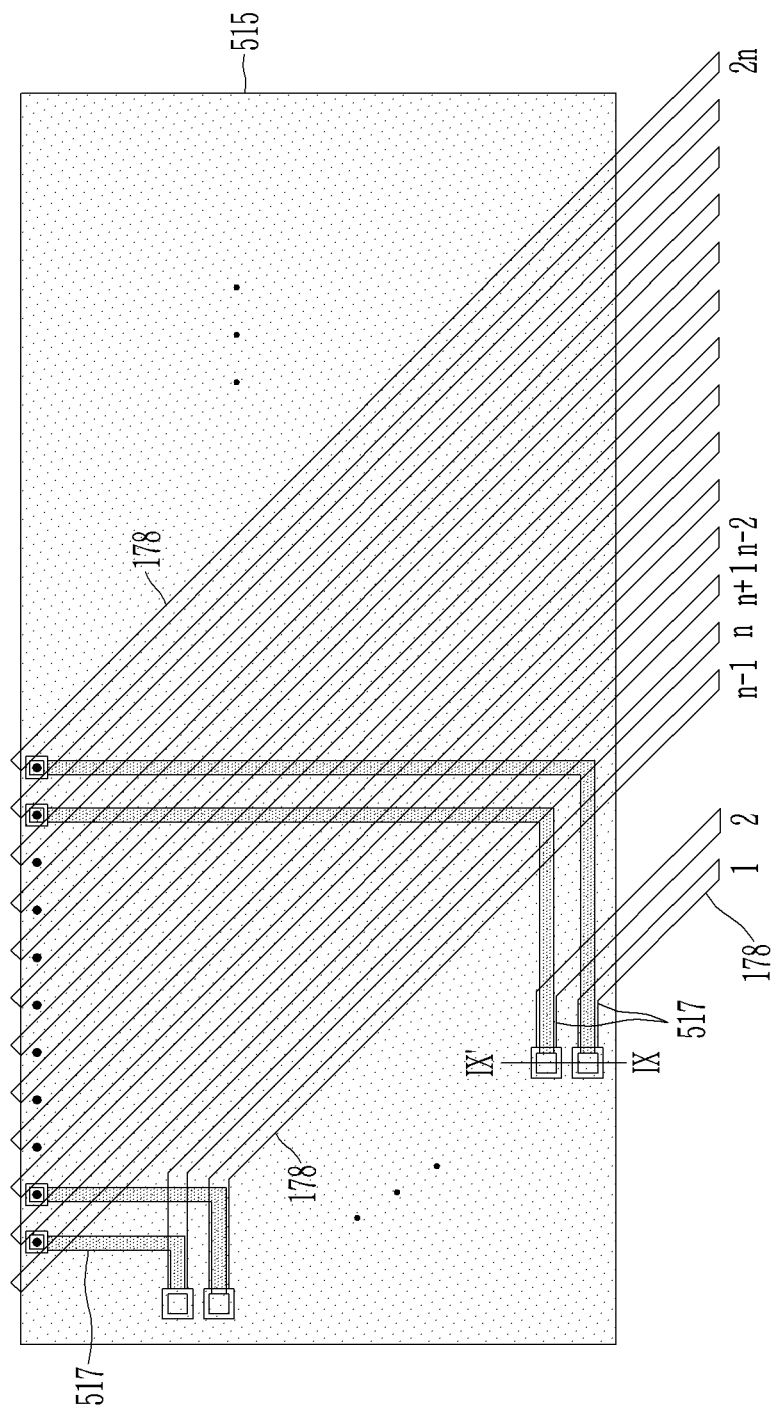
FIG. 10 illustrates the same portion of FIG. 8 in an embodiment.
Figure 11:
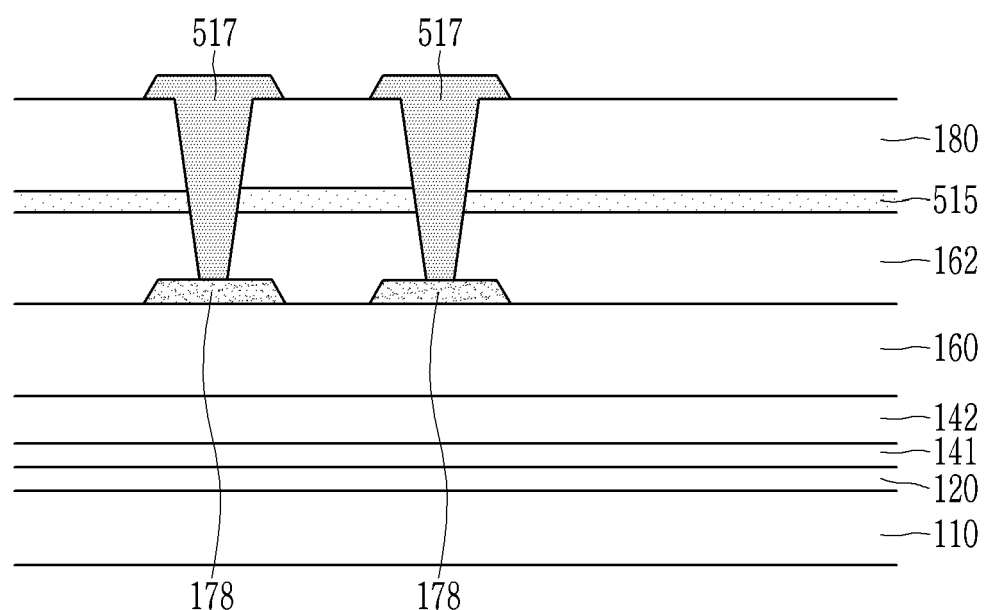
FIG. 11 is a cross-sectional view of FIG. 10, taken along the line IX-IX'.

FIG. 10 is an embodiment illustrating the area A in FIG. 7. FIG. 11 is a cross-sectional view of FIG. 10, taken along the line IX-IX'.

Referring to FIG. 10 and FIG. 11, a display device includes a shield layer 515 that is located on the same layer as a fourth conductive layer.

A protective layer 180 is located on the shield layer 515.

Fifth connection wires 517 are located on the protective layer 180. The fifth connection wires 517 are connected with third connection wires 178 through contact holes, each disposed in the fourth insulation layer 162, the shield layer 515, and the protective layer 180. Where the shield layer 515 is located in such a position, capacitance between the fifth connection wire 517 and the third connection wire 178 can be prevented.

Figure 12:
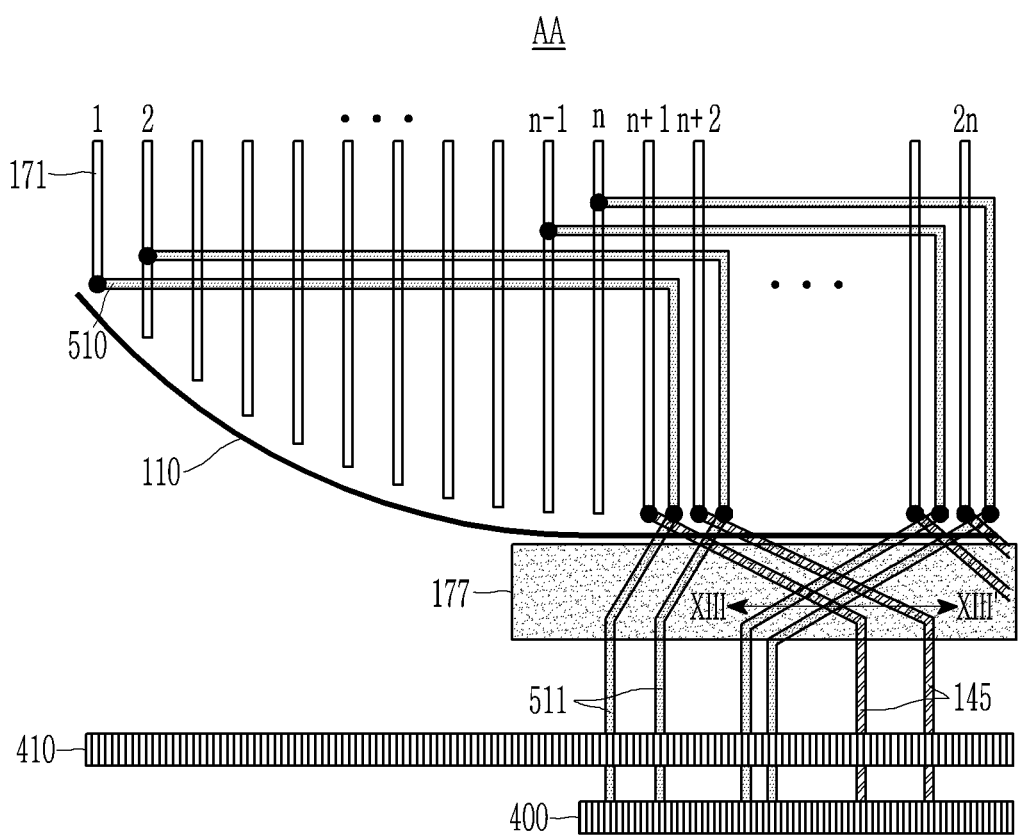
FIG. 12 illustrates a display device according to an embodiment.
Figure 13:
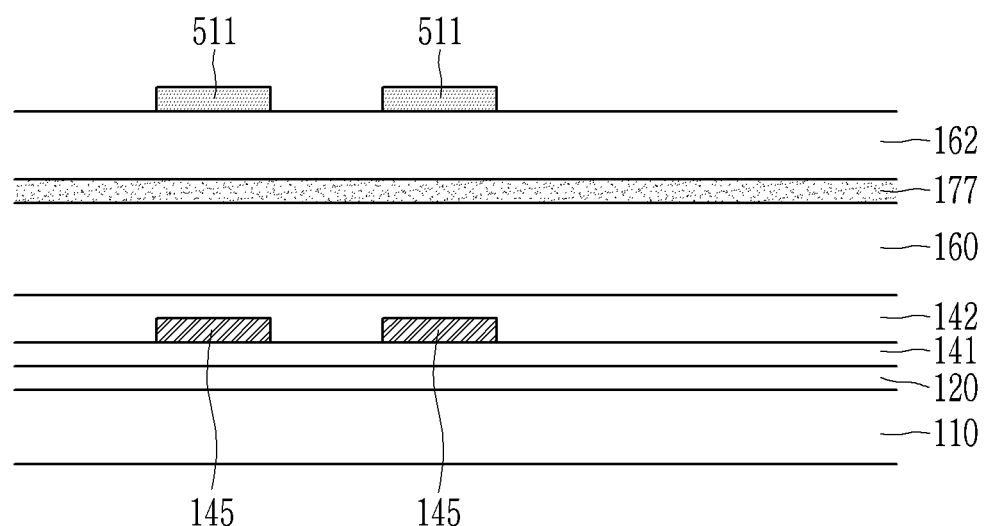
FIG. 13 is a cross-sectional view of FIG. 12, taken along the line XIII-XIII'.

FIG. 12 illustrates a display device according to an embodiment. FIG. 13 is a cross-sectional view of FIG. 12, taken along the line XIII-XIII'. A display device according to an embodiment has the second connection wires 145 and fourth connection wires 511 arrange the order of data lines 171 while crossing each other. Detailed descriptions of identical constituent elements are omitted.

Referring to FIG. 12 and FIG. 13, in a display device according to the present embodiment, data voltage transmission lines 510 are connected with the fourth connection wires 511, and data lines 171 not connected with the data voltage transmission lines 510 are connected with the second connection wires 145.

A shield layer 177 that is on the same layer as the third conductive layer is disposed between the fourth connection wire 511 and the second connection wire 145. A second insulation layer 142, a third insulation layer 160, and a fourth insulation 162 are disposed between the fourth connection wires 511 and the second connection wires 145. As shown in FIG. 12 and FIG. 13, the second connection wires 145 and the fourth connection wires 511 align the connection order of the data lines 171 and a driving circuit portion 400 while crossing each other at different layers.

Figure 14:
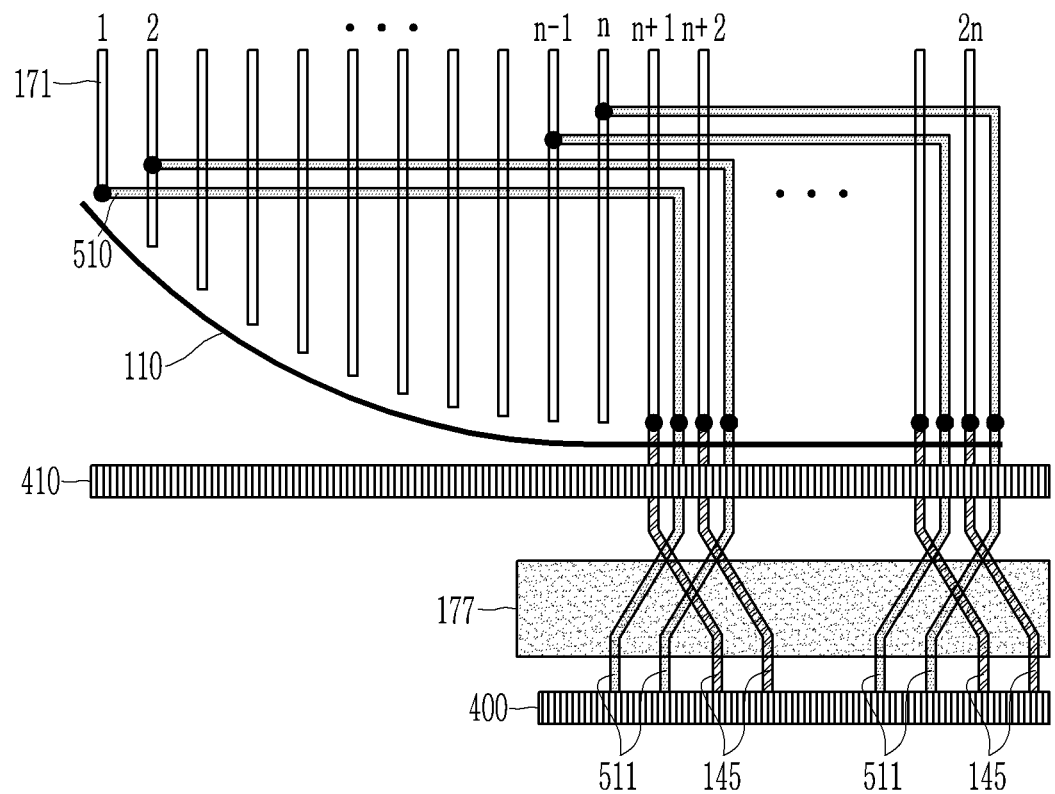
FIG. 14 illustrates the same area as the area shown in FIG. 12 with respect to an embodiment.

FIG. 14 illustrates an embodiment of the same area as the area shown in FIG. 12. In FIG. 14, the second connection wires 145 and fourth connection wires 511 are located between a bending portion 410 and a driving circuit portion 400.

Figure 15:
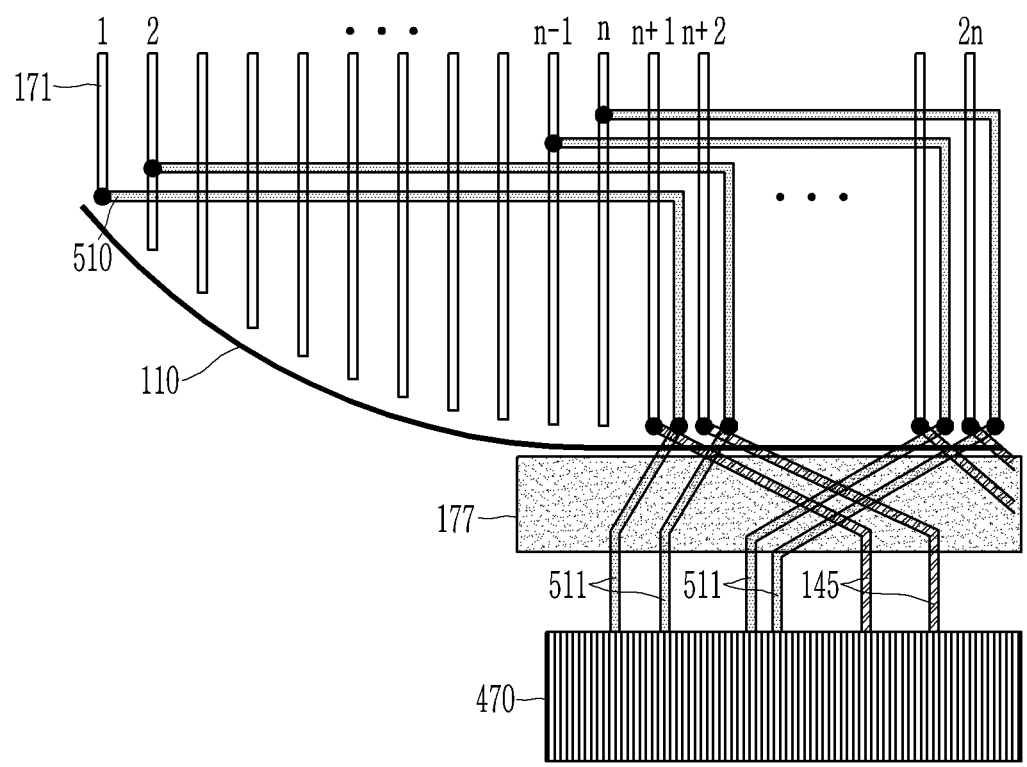
FIG. 15 illustrates the same area as the area shown in FIG. 12 with respect to an embodiment.

FIG. 15 illustrates an embodiment of the same area as the area shown in FIG. 12. In FIG. 15, a chip on film (COF) pad 470 is included instead of a bending portion 410 and a driving circuit portion 400.

Hereinafter, pixels disposed in a substrate 110 of a display device will be described.

Figure 16:
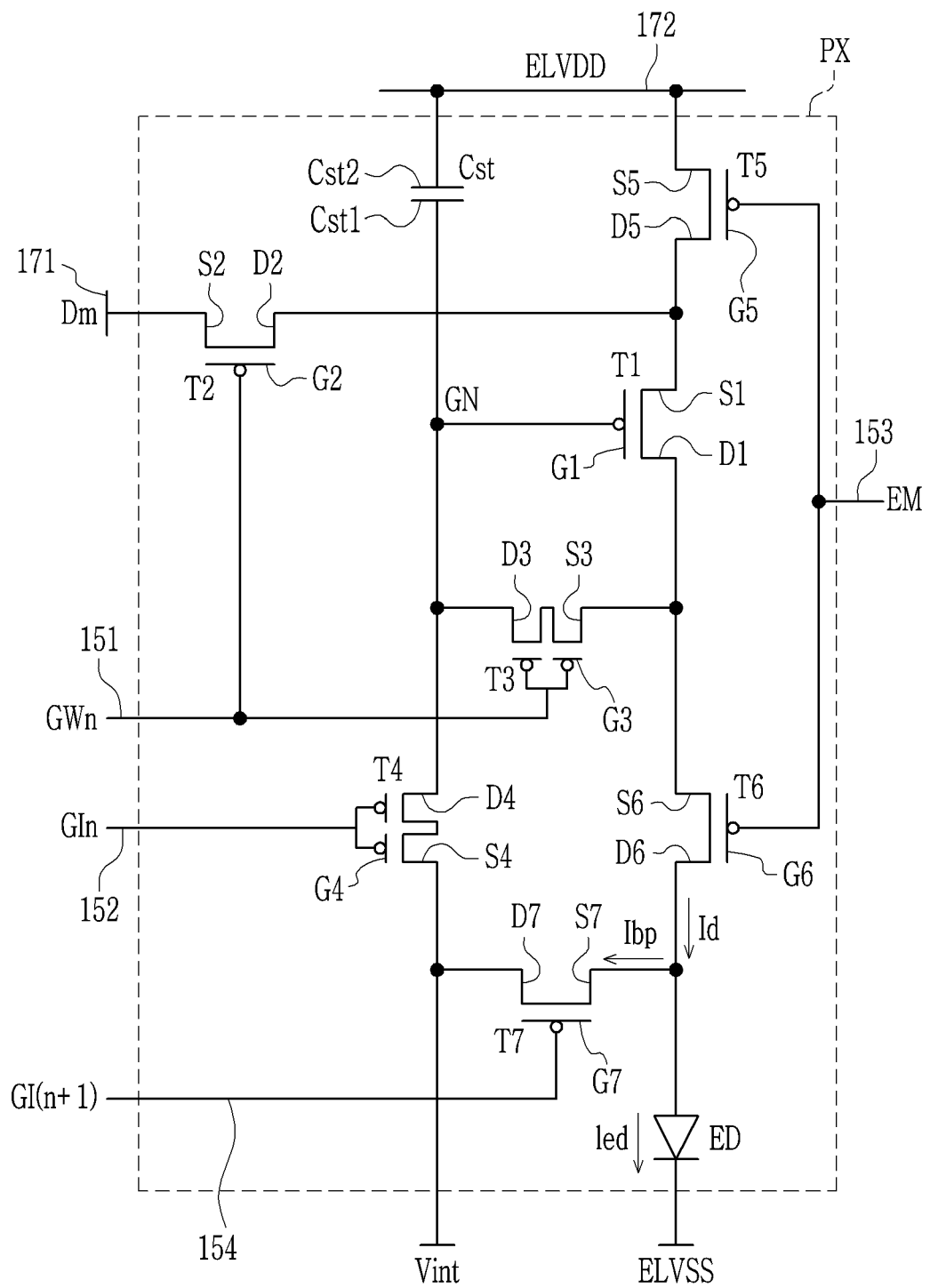
FIG. 16 is an equivalent circuit diagram of one pixel of a display device according to an embodiment.

Hereinafter, referring to FIG. 16, one pixel of a display device according to an embodiment will be described. FIG. 16 is an equivalent circuit diagram of one pixel of a display device according to an embodiment.

As shown in FIG. 16, a display device according to an embodiment includes a plurality of pixels PX that can display an image according to an image signal, and a plurality of signal lines 151, 152, 153, 154, 171, and 172. Each pixel PX may include a plurality of transistors T1, T2, T3, T4, T5, T6, and T7 connected to the plurality of signal lines 151, 152, 153, 154, 171, and 172, a capacitor Cst, and at least one light emitting diode ED. One pixel PX includes one light emitting diode ED.

The signal lines 151, 152, 153, 154, 171, and 172 may include a plurality of scan lines 151, 152, and 154, a plurality of control lines 153, a plurality of data lines 171, and a plurality of driving voltage lines 172.

The plurality of scan lines 151, 152, and 154 may transmit scan signals GWn, GIn, and GI(n+1). The scan signals GWn, GIn, and GI(n+1) may transmit a gate-on voltage and a gate-off voltage that can turn on/turn off the transistors T2, T3, T4, and T7 included in the pixel PX.

The scan lines 151, 152, and 154 connected to one pixel PX may include a first scan line 151 that transmits the scan signal GWn, a second scan line 152 that transmits the scan signal GIn having a gate-on voltage at different timing of the first scan line 151, and a third scan line 154 that transmits the scan signal G(n+1). Below, an instance in which the second scan line 152 transmits the gate-on voltage at earlier timing than the first scan line 151 will be mainly described. For example, when the scan signal GWn is an n-th scan signal Sn (n is a natural number greater than 1), the scan signal GIn may be a previous-stage scan signal such as an (n−1)th scan signal S(n−1) and the scan signal SI(n+1) may be the n-th scan signal Sn. In embodiments, the scan signal GI(n+1) may be a scan signal other than the n-th scan signal Sn.

The control line 153 may transmit a control signal, which may be a light emission control signal that can control light emission of the light emitting diode ED included in the pixel PX. The control signal transmitted by the control line 153 may transmit a gate-on voltage or a gate-off voltage, and may have a different waveform than that of the scan signals transmitted by the scan lines 151, 152, and 154.

The data line 171 transmits a data signal Dm, and the driving voltage line 172 may transmit a driving voltage ELVDD. The data signal Dm may have a different voltage level according to an input image signal, and the driving voltage ELVDD may have a substantially constant level.

The transistors T1, T2, T3, T4, T5, T6, and T7 may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the control line 153 may transmit the light emission control signal EM to the fifth transistor T5 and the sixth transistor T6.

A gate electrode G1 of the first transistor T1 is connected with one end Cst1 of the capacitor Cst through a driving gate node GN, a source electrode S1 of the first transistor T1 is connected with the driving voltage line 172 via the fifth transistor T5, and a drain electrode D1 of the first transistor T1 is electrically connected with an anode of the light emitting diode ED via the sixth transistor T6. The first transistor T1 may receive the data signal Dm transmitted by the data line 171 and supply a driving current Id to the light emitting diode ED according to a switching operation of the second transistor T2.

A gate electrode G2 of the second transistor T2 is connected with the first scan line 151, a source electrode S2 of the second transistor T2 is connected with the data line 171, and a drain electrode D2 of the second transistor T2 is connected with the driving voltage line 172 via the fifth transistor T5 while being connected with the source electrode S1 of the first transistor T1. The second transistor T2 is turned on according to the scan signal GWn transmitted through the first scan line 151, and thus may transmit the data signal Dm transmitted from the data line 171 to the source electrode S1 of the first transistor T1.

A gate electrode G3 of the third transistor T3 is connected to the first scan line 151. A source electrode S3 of the third transistor T3 is connected with the anode of the light emitting diode ED via the sixth transistor T6 while being connected with the drain electrode D1 of the first transistor T1. The drain electrode D3 of the third transistor T3 is connected with the drain electrode D4 of the fourth transistor T4, the first end Cst1 of the capacitor Cst, and the gate electrode G1 of the first transistor T1. The third transistor T3 is turned on according to the scan signal GWn transmitted through the first scan line 151. In this way, the third transistor T3 may diode-connect the gate electrode G1 and the drain electrode D1 of the first transistor T1 by connecting the gate electrode G1 and the drain electrode D1 to each other.

A gate electrode G4 of the fourth transistor T4 is connected with the second scan line 152, a source electrode S4 of the fourth transistor T4 is connected with a terminal of the initialization voltage Vint, and a drain electrode D4 of the fourth transistor T4 is connected with the first end Cst1 of the capacitor Cst and the gate electrode G1 of the first transistor T1 through the drain electrode D3 of the third transistor T3. The fourth transistor T4 is turned on according to the scan signal GIn transmitted through the second scan line 152, and transmits the initialization voltage Vint to the gate electrode G1 of the first transistor T1 such that an initialization operation for initialization of a voltage of the gate electrode G1 of the first transistor T1 can be carried out.

A gate electrode G5 of the fifth transistor T5 is connected with the control line 153, a source electrode S5 of the fifth transistor T5 is connected with the driving voltage line 172, and a drain electrode D5 of the fifth transistor T5 is connected to the source electrode S1 of the first transistor T1 and the drain electrode D2 of the second transistor T2.

A gate electrode G6 of the sixth transistor T6 is connected with the control line 153, a source electrode S6 of the sixth transistor T6 is connected with the drain electrode D1 of the first transistor T1 and the source electrode D3 of the third transistor T3, and a drain electrode D6 of the sixth transistor T6 is electrically connected with the light emitting diode ED. The fifth transistor T5 and the sixth transistor T6 are simultaneously turned on according to the light emission control signal EM transmitted through the control line 153. The driving voltage ELVDD may thus be compensated through the diode-connected first transistor T1 and transmitted to the light emitting diode ED.

A gate electrode G7 of the seventh transistor T7 is connected with the third scan line 154, a source electrode S7 of the seventh transistor T7 is connected with the anode of the light emitting diode ED, and a drain electrode D7 of the seventh transistor T7 is connected with the terminal of the initialization voltage Vint and the source electrode S5 of the fourth transistor T4. Alternatively, the gate electrode G7 of the seventh transistor T7 may be connected to a separate control line (not shown).

Each of the transistors T1, T2, T3, T4, T5, T6, and T7 may be P-type channel transistors such as PMOS and the like, or may be N-type channel transistors.

The first end Cst of the capacitor Cst is connected with the gate electrode G1 of the first transistor T1 as previously described, and a second end Cst2 is connected with the driving voltage line 172. A cathode of the light emitting diode ED may be connected with a terminal of the common voltage ELVSS that transmits the common voltage ELVSS and thus may receive the common voltage ELVSS.

A structure of the pixel PX according to the embodiment is not limited to the structure shown in FIG. 16, and the number of transistors and the number of capacitors included in one pixel PX, and connection relationships, may be variously modified.

Figure 17:
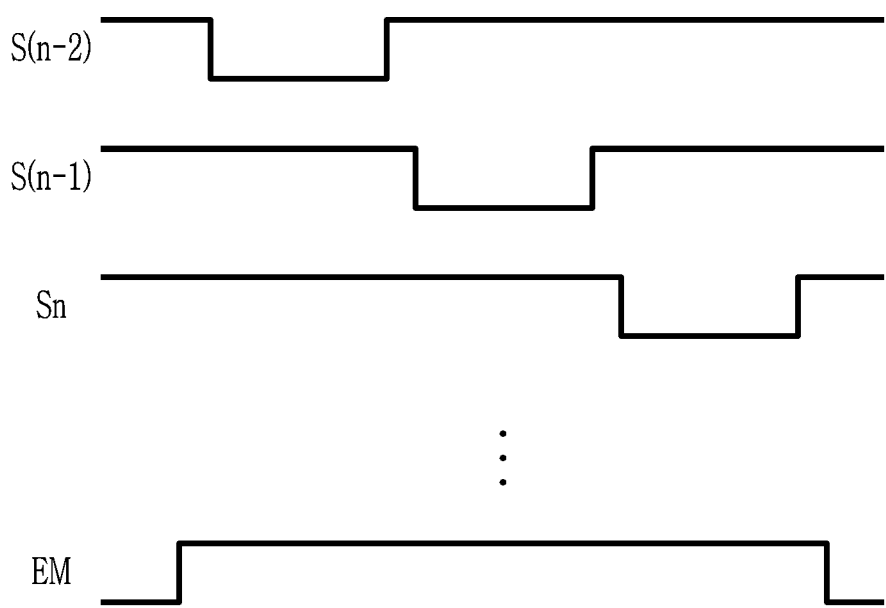
FIG. 17 is a timing diagram of driving signals of a display device according to an embodiment.

Referring to FIG. 17, together with the above-described FIG. 16, an operation of a display device according to an embodiment will be described. Transistors T1, T2, T3, T4, T5, T6, and T7 are illustrated as P-type channel transistors, and an operation during one frame will be described.

FIG. 17 is a timing diagram of driving signals of a display device according to an embodiment.

As shown in FIG. 17, low-level scan signals ( . . . , S(n−2), S(n−1), Sn, . . . ) may be sequentially applied to a plurality of first scan lines 151 connected with a plurality of pixels PX.

During an initialization period, a low-level scan signal GIn is supplied through a second scan line 152. The scan signal GIn may be, for example, an (n−1)th scan signal S(n−1). Then, a fourth transistor T4 is turned on corresponding to the low-level scan signal GIn, and the initialization voltage Vint is applied to the gate electrode G1 of the first transistor T1 through the fourth transistor T4 such that the first transistor T1 is initialized by the initialization voltage Vint.

Next, during a data programming and compensation period, a low-level scan signal GWn is supplied through the first scan line 151, and then the second transistor T2 and the third transistor T3 are turned on corresponding to the low-level scan signal GWn. The scan signal GWn may be, for example, an n-th scan signal Sn. In this case, the first transistor T1 is diode-connected by a turned-on third transistor T3 and biased forward. Then, a compensation voltage Dm+Vth (Vth is a negative value), which is a voltage reduced as much as a threshold voltage Vth of the first transistor T1 from the data signal Dm supplied from the data line 171, is applied to the gate electrode G1 of the first transistor T1. That is, a gate voltage applied to the gate electrode G1 of the first transistor T1 may become the compensation voltage (Dm+Vth).

The driving voltage ELVDD and the compensation voltage (Dm+Vth) are applied to opposite ends of the capacitor Cst, and charges that correspond to a difference of voltages at the opposite ends of the capacitor Cst may be stored in the capacitor Cst.

Next, during a light emission period, the light emission control signal EM supplied from the control line 153 is changed to a low level from a high level. The light emission control signal EM may be changed after application of the scan signal GWn to all the first signal lines 151 in one frame. Then, during the light emission period, the fifth transistor T5 and the sixth transistor T6 are turned on by the low-level light emission control signal EM. Subsequently, a driving current Id according to a voltage difference between a gate voltage of the gate electrode G1 of the first transistor T1 and the driving voltage ELVDD is generated, and the driving current Id is supplied to the light emitting diode ED through the sixth transistor T6 so that the driving current Id flows to the light emitting diode ED. During the light emission period, a gate-source voltage Vgs of the first transistor T1 is maintained at (Dm+Vth)−ELVDD by the capacitor Cst, and according to a current-voltage relationship of the first transistor T1, the driving current Id may be proportional to the square of a value obtained by subtracting a threshold voltage from a driving gate-source voltage, that is, $(Dm-ELVDD)^2$. Accordingly, the driving current Id may be determined without regard to the threshold voltage Vth of the first transistor T1.

Meanwhile, during the initialization period, the seventh transistor T7 receives a low-level scan signal GI(n+1) through the third scan line 154 to be turned on. The scan signal GI(n+1) may be the n-th scan signal Sn. In this case, the seventh transistor T7 may be simultaneously turned on with the second and third transistors T2 and T3. A part of the driving current Id may pass through the seventh transistor T7 as a bypass current Ibp by the turned-on seventh transistor T7.

Figure 18:
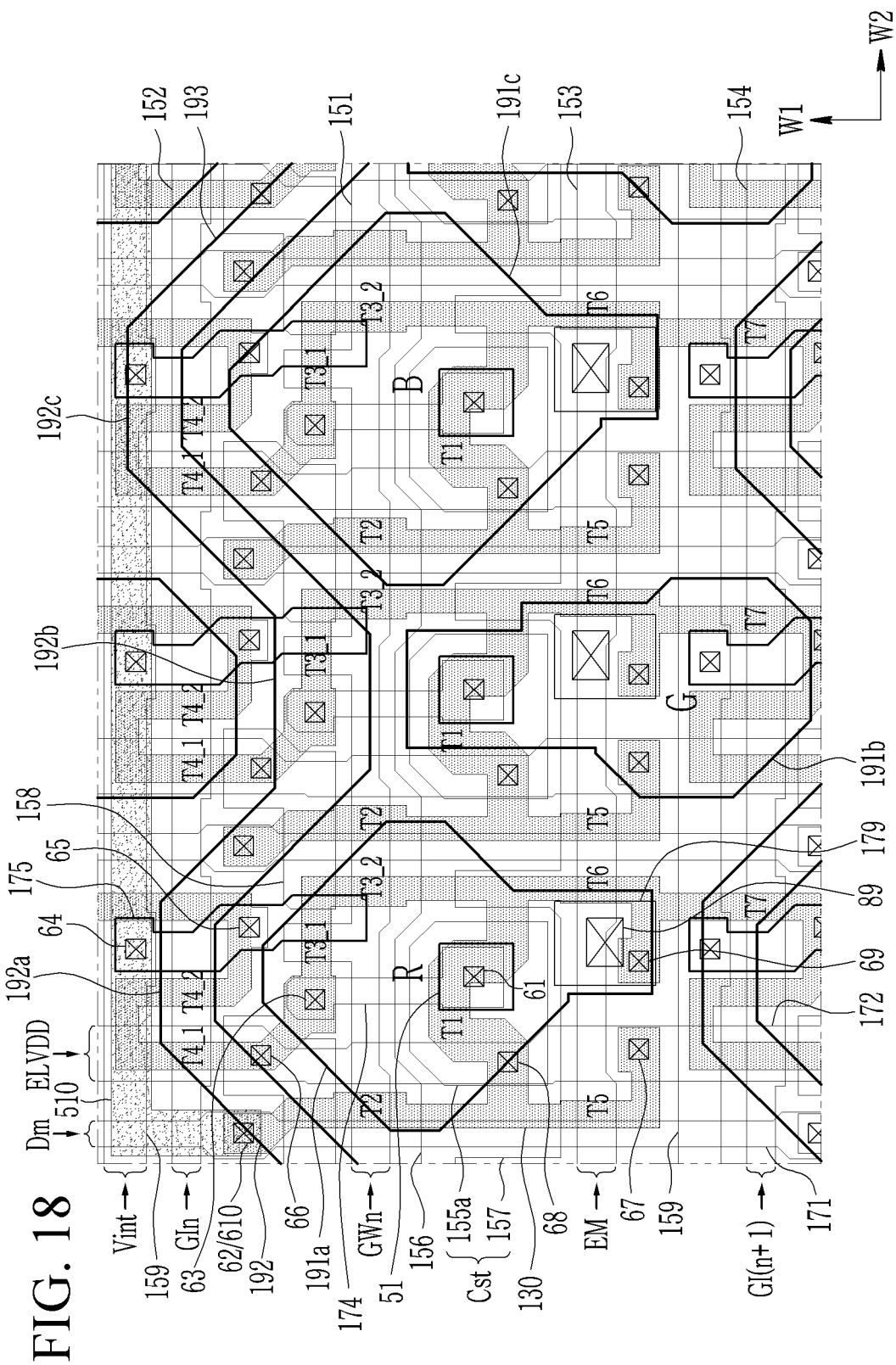
FIG. 18 is a top plan view of a plurality of pixels that are adjacent to each other in a display device according to an embodiment.
Figure 19:
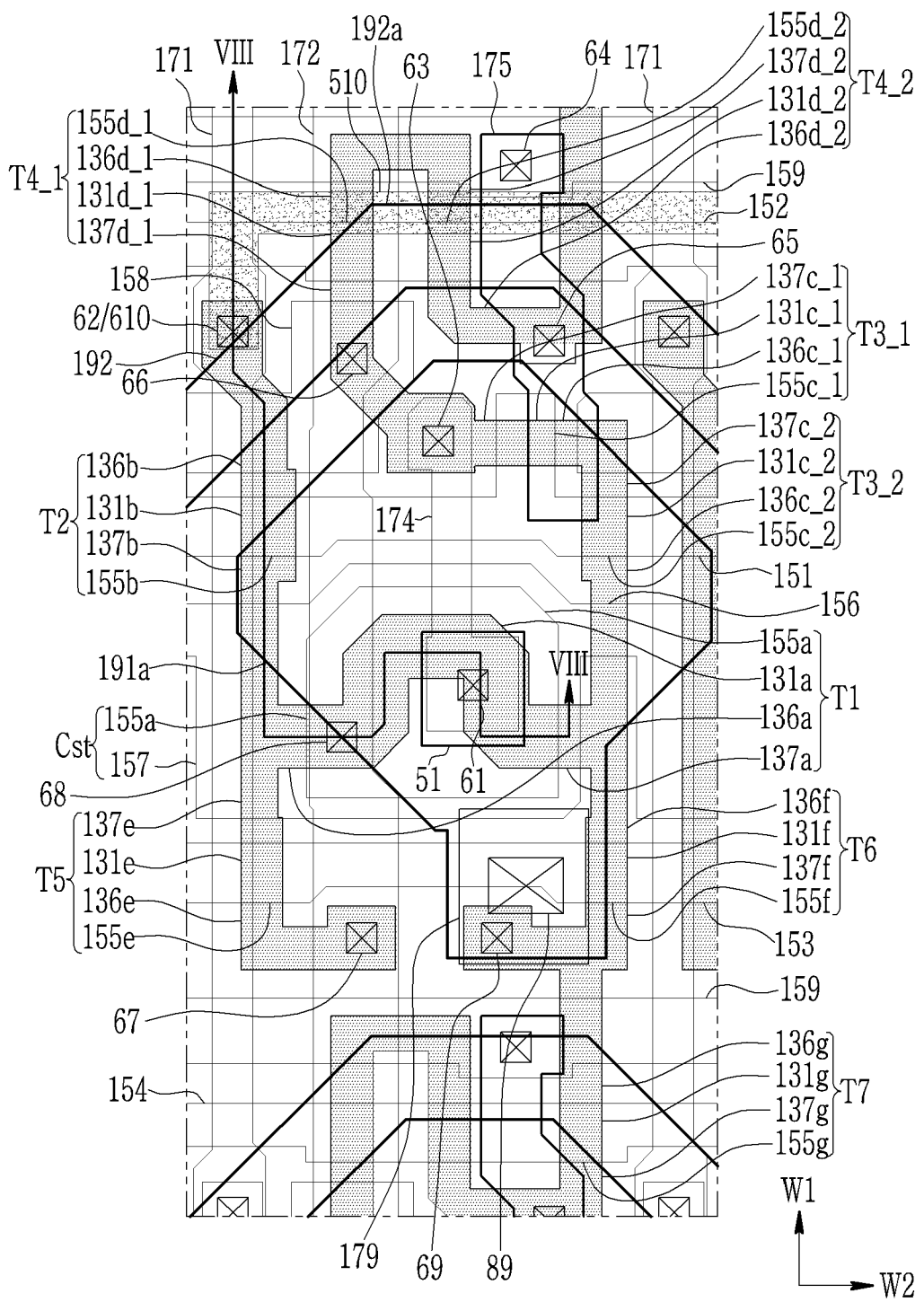
FIG. 19 is a top plan view illustrating one pixel among the plurality of pixels of FIG. 18.
Figure 20:
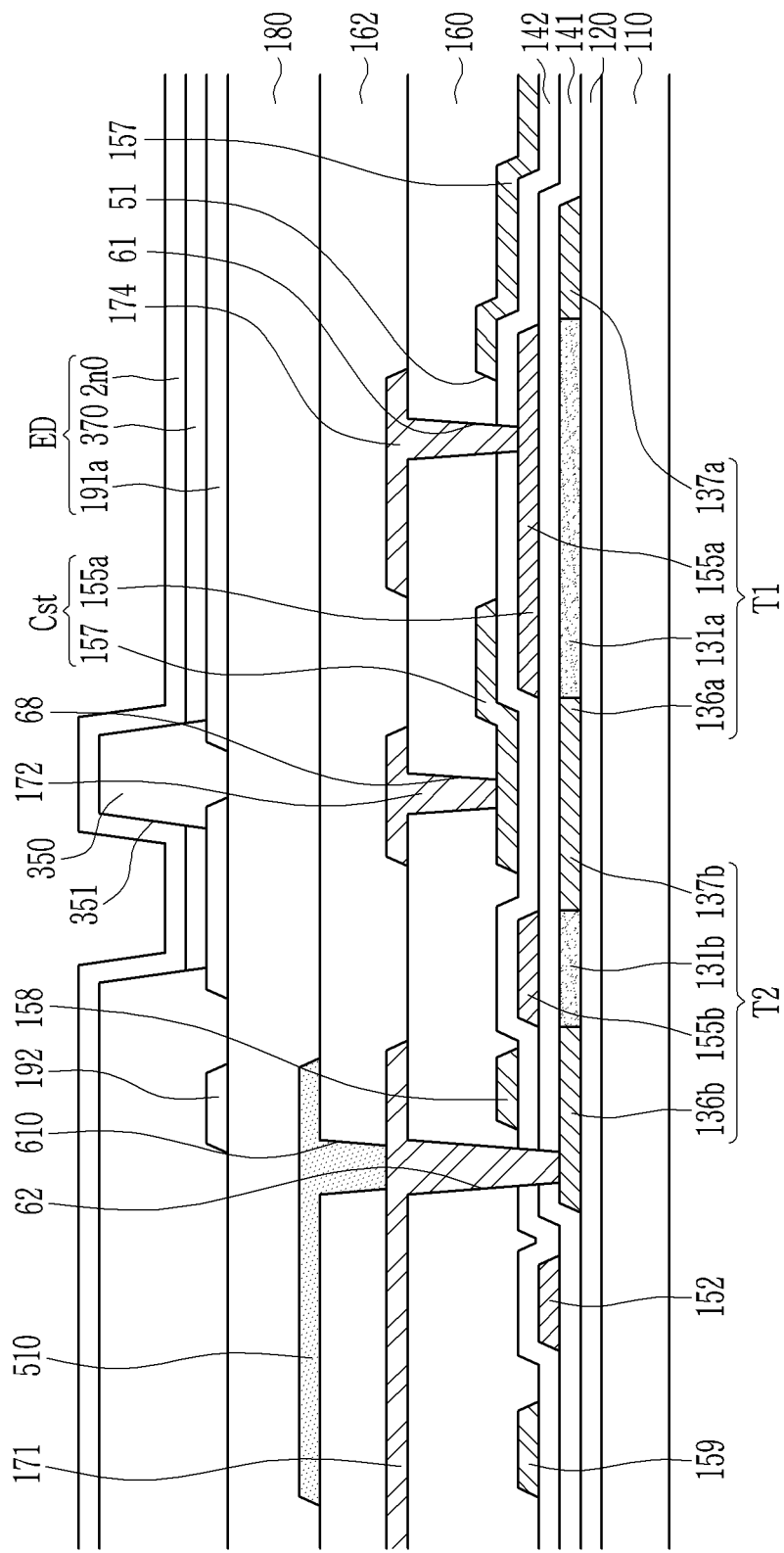
FIG. 20 is a cross-sectional view of FIG. 19, taken along the line VIII-VIII'.

Referring to FIG. 18 to FIG. 20, together with the above-described FIG. 16 and FIG. 17, a structure of a partial area of a display device according to an embodiment will be described in detail.

FIG. 18 is a top plan view of a plurality of pixels that are adjacent to each other in a display device according to an embodiment, FIG. 19 is a top plan view illustrating one pixel among the plurality of pixels of FIG. 18, and FIG. 20 is a cross-sectional view of FIG. 19, taken along the line VIII-VIII'. FIG. 18 to FIG. 20 illustrate pixels located in first side portions (115 of FIG. 1) and edge portions (112 of FIG. 1) of a substrate 110.

The plurality of pixels PX included in the display device according to an embodiment may represent specific colors. For example, the plurality of pixels may include red pixels R representing red, green pixels G representing green, and blue pixels B representing blue. FIG. 18 illustrates a red pixel R, a green pixel G, and a blue pixel B that are adjacent to each other. In embodiments, at least one of the red pixel R, the green pixel G, and the blue pixel B may represent a different color. In addition, a pixel that may represent a color other than red, green, and blue may further be included.

The display device according to the embodiment may include a first conductive layer that includes a first scan line 151 transmitting a scan signal GWn, a second scan line 152 transmitting a scan signal GIn, a third scan line 154 transmitting a scan signal GI(n+1), and a control line 153 transmitting a light emission control signal EM. In addition, the first conductive layer may include first connection wires as shown in FIG. 3. The first conductive layer may be disposed on one side of the substrate 110 on a cross-section.

The substrate 110 may include an inorganic insulation material such as glass, plastic, and the like or an organic insulation material, may have various degrees of flexibility.

The plurality of scan lines 151, 152, and 154 and the control line 153 may extend mostly in a second direction W2 on a plane. The first scan line 151 may be disposed between the second scan line 152 and the control line 153 on a plane. When the display device is viewed as a whole, the third scan line 154 is substantially the same as the second scan line 152, and may transmit a scan signal GI(n+1) that is the next scan signal after the scan signal GIn transmitted by the second scan line 152. As previously described, when the first scan line 151 transmits an n-th scan signal Sn, the third scan signal 154 may also transmit the n-th scan signal Sn.

The display device according to the embodiment may further include a second conductive layer that includes a storage line 156 and an initialization voltage line 159. In addition, the second conductive layer may include the second connection wire 145 as shown in FIG. 3. The second conductive layer is located on a different layer from the first conductive layer. For example, the second conductive layer may be located directly on the first conductive in a cross-sectional view.

The storage line 156 and the initialization voltage line 159 may extend mostly in the second direction W2 on a plane. The storage line 156 may be located between the first scan line 151 and the control line 153 on a plane, may include an expansion portion 157 that is located in each of the pixels R, G, and B. The expansion portion 157 is connected with the driving voltage line 172 through a contact hole 68 and thus may receive a driving voltage ELVDD. A storage opening 51 is formed in the expansion portion 157.

The initialization voltage line 159 transmits an initialization voltage Vint, and may be disposed between the third scan line 154 and the control line 153 on a plane.

The display device according to the embodiment may further include a third conductive layer that includes a data line 171 transmitting a data signal Dm, a driving voltage line 172 transmitting a driving voltage ELVDD, and the like. The third conductive layer may further include a shield layer 177 as shown in FIG. 5, and/or third connection wires 178 as shown in FIG. 9 or FIG. 11. The third conductive layer is disposed on a layer that is different from the first conductive layer and the second conductive layer on a cross-section. For example, the third conductive layer may be located on the second conductive layer in a cross-sectional view.

The data line 171 and the driving voltage line 172 may extend mostly in the first direction W1 on a plane, and may cross the plurality of scan lines 151, 152, and 154, the control line 153, the initialization voltage line 159, and the storage line 156.

Each of the pixels R, G, and B may include a plurality of transistors T1, T2, T3, T4, T5, T6, and T7, a capacitor Cst, and a light emitting diode ED connected with the scan lines 151, 152, and 154, the control line 153, the data line 171, and the driving voltage line 172.

A channel of each of the plurality of transistors T1, T2, T3, T4, T5, T6, and T7 with respect to each of the pixels R, G, and B may be formed inside one active pattern 130, and the active pattern 130 may be curved in various shapes. The active pattern 130 may include a semiconductor material such as a polysilicon, an oxide semiconductor, and the like.

The active pattern 130 may be located between the substrate 110 and the first conductive layer in a cross-sectional view.

The active pattern 130 may include channel regions 131a, 131b, 131c_1, 131c_2, 131d_1, 131d_2, 131e, 131f, and 131g that respectively form channels of the respective transistors T1, T2, T3, T4, T5, T6, and T7, and a conductive region. In particular, the third transistor T3 and the fourth transistor T4 may have a dual gate structure. The third transistor T3 may include two channel regions 131c_1 and 131c_2, and the fourth transistor T4 may include two channel regions 131d_1 and 131d_2.

The conductive region of the active pattern 130 are disposed at opposite sides of each of the channel regions 131a, 131b, 131c_1, 131c_2, 131d_1, 131d_2, 131e, 131f, and 131g, and have a higher carrier concentration than that of each of the channel regions 131a, 131b, 131c_1, 131c_2, 131d_1, 131d_2, 131e, 131f, and 131g. Most portions of the active pattern 130 may be the conductive regions, except for the channel regions 131a, 131b, 131c_1, 131c_2, 131d_1, 131d_2, 131e, 131f, and 131g. A pair of conductive regions disposed at opposite sides of each of the channel regions 131a, 131b, 131c_1, 131c_2, 131d_1, 131d_2, 131e, 131f, and 131g of each of the transistor T1, T2, T3, T4, T5, T6, and T7 are source regions and drain regions of the corresponding transistors T1, T2, T3, T4, T5, T6, and T7 and may serve as source electrodes and drain electrodes, respectively.

The first transistor T1 includes a channel region 131a and a driving gate electrode 155a that overlaps the channel region 131a on a plane. The first transistor T1 also includes a source region 136a and a drain region 137a that are conductive regions of the active pattern 130, located at opposite sides of the channel region 131a.

The channel region 131a of the first transistor T1 may be bent at least once. For example, the channel region 131a may have a meandering shape or a zigzag shape.

The source region 136a and the drain region 137a may be connected to opposite sides of the channel region 131a on a plane.

A driving gate electrode 155a may be included in the first conductive layer, and may be connected with a connection member 174 through a contact hole 61 and the storage opening 51. The storage opening 51 surrounds the contact hole 61. The connection member 174 may be included in the third conductive layer. The connection member 174 may extend in a direction that is parallel with an extension direction of the data line 171. The connection member 174 corresponds to a driving gate node GN in the circuit diagram shown in FIG. 16, together with the driving gate electrode 155a.

The second transistor T2 includes the channel region 131b and a gate electrode 155b that overlaps the channel region 131b on a plane. The second transistor T2 also includes a source region 136b and a drain region 137 that are conductive regions of the active pattern 130, located at opposite sides of the channel region 131b. The gate electrode 155b is a part of the first scan line 151. With reference to the first scan line 151, the source region 136b is disposed in an upper portion on a plane and connected with the channel region 131b, and is connected with the data line 171 through a contact hole 62. With reference to the first scan line 151, the drain region 137b is disposed in a lower portion on a plane and connected with the channel region 131b, and is connected with the source region 136a of the first transistor T1.

The third transistor T3 may be formed of two portions for preventing a leakage current. That is, the third transistor T3 may include an upper third transistor T3_1 and a lower third transistor T3_2 adjacent to each other and in contact.

The upper third transistor T3_1 includes a channel region 131c_1 that overlaps the first scan line 151 on a plane, a source region 136c_1 and a drain region 137c_1 that are conductive regions of the active pattern 130, located at opposite sides of the channel region 131c_1, and a gate electrode 155c_1 that overlaps the channel region 131c_1. The gate electrode 155c_1 may be a part of a protrusion of the first scan line 151. With reference to the first scan line 151, the drain region 137c_1 is located in an upper portion and connected with a connection member 174 through a contact hole 63.

The lower third transistor T3_2 includes a channel region 131c_2 that overlaps the first scan line 151 on a plane and a gate electrode 155c_2 that overlaps the channel region 131c_2. The lower third transistor T3_2 further includes a channel region 131c_2 that overlaps the first scan line 151 on a plane, a source region 136c_2 and a drain region 137c_2 that are conductive regions of the active pattern 130, located at opposite sides of the channel region 131c_2. The gate electrode 155c_2 is part of the first scan line 151. The source region 136c_2 of the lower third transistor T3_2 is connected with the drain region 137a of the first transistor T1, and the drain region 137c_2 is connected with the source region 136c_1 of the upper transistor T3_1.

The fourth transistor T4 may also be formed of two portions for preventing a leakage current. That is, the fourth transistor T4 may include a left fourth transistor T4_1 and a right fourth transistor T4_2 adjacent to each other and in contact.

The left fourth transistor T4_1 includes a channel region 131d_1 that overlaps the second scan line 152 on a plane and a gate electrode 155d_1 that overlaps the channel region 131d_1. The left fourth transistor T4_1 also includes a source region 135d_1 and a drain region 137d_1 that are conductive regions of the active pattern 130, located at opposite sides of the channel region 131d_1. The gate electrode 155d_1 is part of the second scan line 152. With reference to the second scan line 152, the drain region 137d_1 is located in a lower portion, and is connected with the drain region 137d_1 and the connection member 174 through the contact hole 63.

The right fourth transistor T4_2 includes a channel region 131d_2 that overlaps the second scan line 152 on a plane and a gate electrode 155d_2 that overlaps the channel region 131d_2. The right fourth transistor T4_2 also includes a source region 136d_2 and a drain region 137d_2 that are conductive regions of the active pattern 130, located at opposite sides of the channel region 131d_2. The gate electrode 155d_2 is part of the second scan line 152. The drain region 137d_2 is connected with the source region 136d_1 of the left fourth transistor T4_1, and the source region 136d_2 is connected with the connection member 175 through a contact hole 65.

The connection member 175 may be included in the third conductive layer in a cross-sectional view. The connection member 175 may be electrically connected with the initialization voltage line 159 through a contact hole 64.

The fifth transistor T5 includes a channel region 131e, and a gate electrode 155e that overlaps the channel region 131e. The fifth transistor T5 also includes a source region 136e and a drain region 137e that are conductive regions of the active pattern 130, located at opposite sides of the channel region 131e. The gate electrode 155e is part of the control line 153. With reference to the control line 153, the source region 136e is located in a lower portion on a plane and connected with the channel region 131e, and is connected with the driving voltage line 172 through a contact hole 67. With reference to the control line 153, the drain region 137e is located in an upper portion on a plane and connected with the channel region 131e, and is connected with the source region 136a of the first transistor T1.

The sixth transistor T6 includes a channel region 131f, and a gate electrode 155f that overlaps the channel region 131f. The sixth transistor T6 also includes a source region 136f, and a drain region 137f that are conductive regions of the active pattern 130, located at opposite sides of the channel region 131f. The gate electrode 155f is a part of the control line 153. With reference to the control line 153, the source region 136f is disposed in an upper portion on a plane and connected with the channel region 131f, and is connected with the drain region 137a of the first transistor T1. With reference to the control line 153, the drain region 137f is disposed in a lower portion on a plane and connected with the channel region 131f, and is connected with a connection member 179 through a contact hole 69. The connection member 179 may be included in the third conductive layer on a cross-section.

The seventh transistor T7 includes a channel region 131g and a gate electrode 155g that overlaps the channel region 131g. The seventh transistor T7 also includes a source region 136g and a drain region 137g that are conductive regions of the active pattern 130, located at opposite sides of the channel region 131g. The gate electrode 155g is a part of the third scan line 154. With reference to the third scan line 154, the source region 136g is disposed in an upper portion on a plane and connected with the channel region 131g, and is connected with the drain region 137f of the sixth transistor T6. With reference to the third scan line 154, the drain region 137g is disposed in a lower portion on a plane, and may receive the initialization voltage Vint by being connected with the connection member 175 through the contact hole 65.

The capacitor Cst may include the driving gate electrode 155a and the expansion portion 157 of the storage line 156 that overlap each other on a plane as two terminals. The capacitor Cst may maintain a voltage that corresponds to a voltage difference between the expansion portion 157 of the storage line 156, receiving the driving voltage ELVDD, and the driving gate electrode 155a. The expansion portion 157 of the storage line 156 may have a wider area than the driving gate electrode 155a on a plane, and may cover the entire area of the corresponding driving gate electrode 155a.

The second conductive layer may further include a shield pattern 158 that overlaps the data line 171. The shield pattern 158 is connected with the driving voltage line 172 through a contact hole 66 and thus may receive the driving voltage ELVDD. The shield pattern 158 shields between the driving gate node GN and the data line 171 to prevent a change in the voltage of the driving gate node GN due to a change in the data signal Dm. The shield pattern 158 may be omitted.

The display device according to the embodiment may further include a fourth conductive layer that includes a data voltage transmission line 510 transmitting the data signal Dm. The fourth conductive layer is located on a layer different from the first conductive layer, the second conductive layer, and the third conductive layer. For example, the fourth conductive layer may be located on the third conductive layer. The fourth conductive layer may include a fourth connection wire 511.

At least a part of the data voltage transmission line 510 located in first side portions 115 and edge portions 112 of the substrate 110 may extend along the second direction W2 on a plane.

An end of the data voltage transmission line 510 may overlap the data line 171. The data voltage transmission line 510 may transmit the data signal Dm by being connected with the data line 171 through a contact hole 610. The data voltage transmission line 510 is disposed on a layer different from that of the data line 171.

The data line 171 located in the first side portions 115 and the edge portions 112 of the substrate 110 is not directly connected with a driving circuit portion 400. Since the data voltage transmission line 510 connects the data line 171 located in the first side portions 115 and the edge portions 112 of the substrate 110 and the driving circuit portion 400, the data voltage transmission line 510 can transmit the data signal Dm.

The display device according to the embodiment may further include a fifth conductive layer that includes a plurality of pixel electrodes 191*a*, 191*b*, and 191*c* and a pixel conductive pattern 192. The fifth conductive layer is disposed on a layer that is different from the first conductive layer, the second conductive layer, the third conductive layer, and the fourth conductive layer on a cross-section. For example, the fifth conductive layer may be located on the fourth conductive layer on a cross-section.

The plurality of pixel electrodes 191*a*, 191*b*, and 191*c* may be arranged in a PenTile matrix. For example, a pixel electrode 191*a* of a red pixel R and a pixel electrode 191*c* of a blue pixel B may be alternately arranged in a horizontal direction, the pixel electrode 191*a* of the red pixel R and a pixel electrode 191*b* of a green pixel G may be alternatively arranged in a diagonal direction, and the pixel electrode 191*c* of the blue pixel B and the pixel electrode 191*b* of the green pixel G may be alternately arranged in another diagonal direction.

Each of the pixel electrodes 191*a*, 191*b*, and 191*c* may be connected with the connection member 179 through a contact hole 89, and thus may receive a voltage.

The pixel conductive pattern 192 may be curved along edges of adjacent pixel electrodes 191*a*, 191*b*, and 191*c*, and may include straight line portions 192*a*, 192*b*, and 192*c* and an oblique line portion 193 that are alternately arranged. The straight line portions 192*a*, 192*b*, and 192*c* may mostly extend in parallel with the scan lines 151, 152, and 154, and the oblique line portion 193 may extend oblique to the extension direction of the straight line portions 192*a*, 192*b*, and 192*c*. The straight line portion 192*a* is adjacent at the top of the pixel electrode 191*a* of the red pixel R, the straight portion 192*b* is adjacent at the top of the pixel electrode 191*b* of the green pixel G, and the straight line portion 192*c* is adjacent at the top of the pixel electrode 191*c* of the blue pixel B.

The pixel conductive pattern 192 may transmit the initialization voltage Vint.

Hereinafter, a cross-sectional structure of the display device according to the embodiment will be described in further detail.

A buffer layer 120 may be located on the substrate 110. The buffer layer 120 blocks the transfer of an impurity from the substrate 110 to an upper layer of the buffer layer 120, particularly, the active pattern 130, thereby improving the characteristics of the active pattern 130 and relieving stress. The buffer layer 120 may include an inorganic insulation material such as a silicon nitride (SiNx) or a silicon oxide (SiOx), and/or an organic insulation material. At least a part of the buffer layer 120 may be omitted.

The active pattern 130 is located on the buffer layer 120, and a first insulation layer 141 is located on the active pattern 130.

The first conductive layer may be located on the first insulation layer 141. The first conductive layer may include a metal such as copper (Cu), aluminum (Al), molybdenum (Mo), and an alloy thereof.

A second insulation layer 142 may be located on the first conductive layer and the first insulation layer 141.

The second conductive layer may be located on the second insulation layer 142. The second conductive layer may include a metal such as copper (Cu), aluminum (Al), molybdenum (Mo), and an alloy thereof.

A third insulation layer 160 may be located on the second conductive layer and the second insulation layer 142.

At least one of the first insulation layer 141, the second insulation layer 142, and the third insulation layer 160 may include an inorganic insulation material such as a silicon nitride (SiNx), a silicon oxide (SiOx), and the like, and/or an organic insulation material.

A contact hole 61 located on the driving gate electrode 155*a* may be formed in the first insulation layer 141, the second insulation layer 142, and the third insulation layer 160, a contact hole 62 located on the source electrode 136*b* of the second transistor T2, a contact hole 62 located on the drain region 137*c*_1 of the upper third transistor T3_1 or the drain region 137*d*_1 of the left fourth transistor T4_1, a contact hole 64 located on the initialization voltage line 159, a contact hole 65 located on the source region 136*d*_2 of the right transistor T4_2 or the drain region 137*g* of the seventh transistor T7, a contact hole 66 located on the shield pattern 158, a contact hole 68 located on the source region 136*e* of the fifth transistor T5, a contact hole 68 located on the expansion portion 157 of the storage line 156, and a contact hole 69 located on the drain region 137*f* of the sixth transistor T6 may be formed.

The third conductive layer may be located on the third insulation layer 160. The third conductive layer may include a metal such as copper (Cu), aluminum (Al), molybdenum (Mo), and an alloy thereof.

The expansion portion 157 of the storage line 156 may form the capacitor Cst by overlapping the driving gate electrode 155*a* while disposing the second insulation layer 142 therebetween.

The fourth insulation layer 162 may be located on the third conductive layer and the third insulation layer 160.

The fourth insulation layer 162 may include an inorganic insulation material such as a silicon nitride (SiNx), a silicon oxide (SiOx), and the like, and/or an organic insulation material.

The contact hole 610 located on the data line 171 may be formed in the fourth insulation layer 162.

The fourth conductive layer may be located on the fourth insulation layer 162. The fourth conductive layer may include a metal such as copper (Cu), aluminum (Al), molybdenum (Mo), and an alloy thereof.

A protective layer 180 is located on the fourth conductive layer and the fourth insulation layer 162. That is, portions of the protective layer 180 are on the fourth conductive layer including data voltage transmission line 510 and portions of the protective layer 180 are level with, i.e., on the same layer as, portions of the driving voltage transmission line 520. The protective layer 180 may include an organic insulation material such as a polyacrylic resin, a polyimide resin, and the like, and the protective layer 180 may have a substantially flat top surface. The protective layer 180 may include the contact hole 89 disposed on the connection member 179.

The above-described fifth conductive layer may be located on the protective layer 180.

A pixel defining layer (PDL) 350 may be disposed on the protective layer 180 and the fifth conductive layer. The pixel defining layer 350 includes an opening 351 located on the pixel electrodes 191*a*, 191*b*, and 191*c*.

An emission layer 370 is located on the pixel electrodes 191*a*, 191*b*, and 191*c*. The emission layer 370 may be disposed inside the opening 351. The emission layer 370 may include an organic light emitting material or an inorganic light emitting material.

A common electrode 270 is located on the emission layer 370. The common electrode 270 is also formed on the pixel defining layer 350 such that may extend throughout the plurality of the pixels.

The pixel electrodes 191*a*, 191*b*, and 191*c*, the emission layer 370, and the common electrode 270 form a light emitting diode ED.

An encapsulation layer (not shown) that protects the light emitting diode ED may be further provided on the common electrode 270. The encapsulation layer may include an inorganic layer and an organic layer that are alternately stacked.

Figure 21:
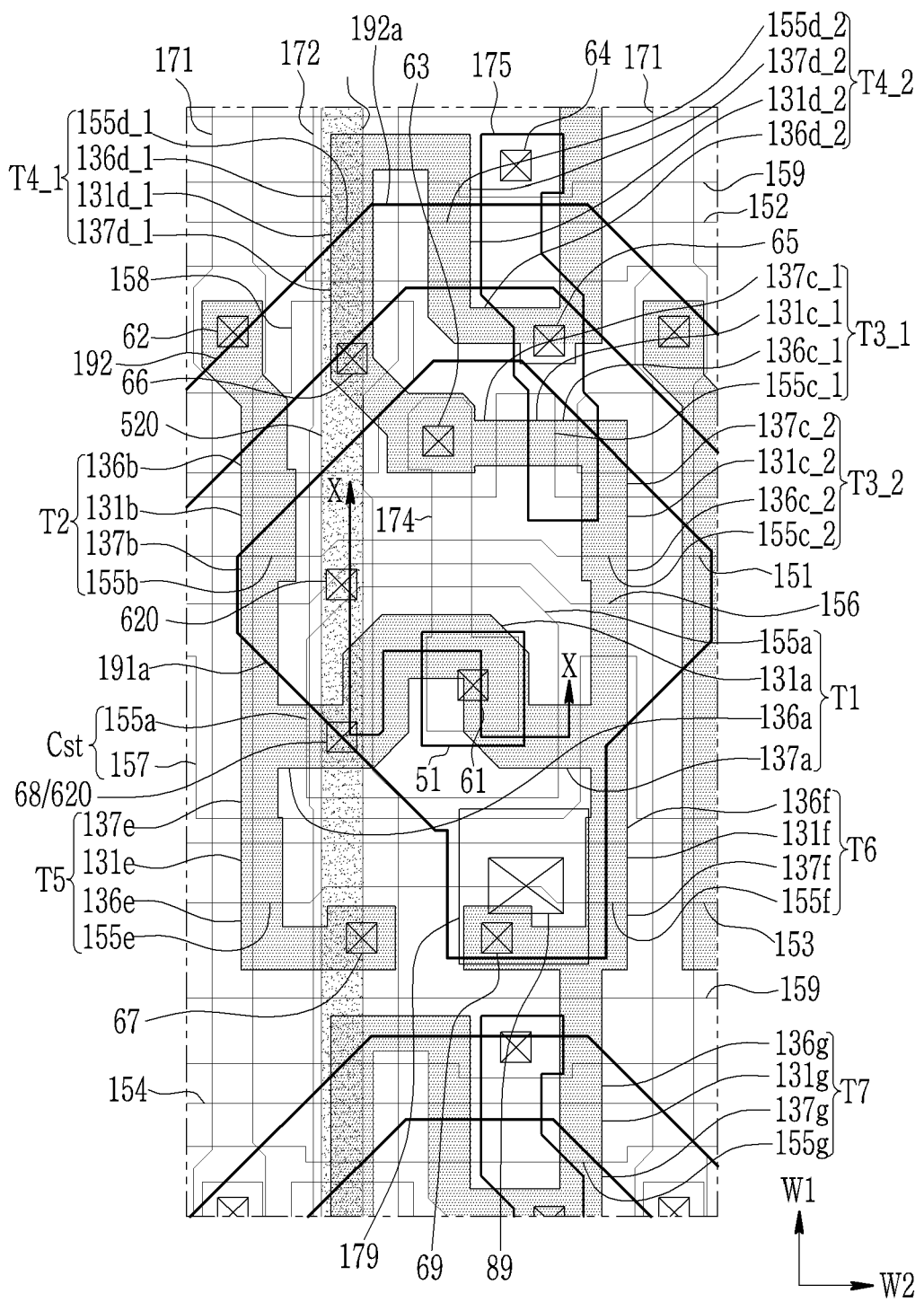
FIG. 21 is a top plan view of a pixel of a display device according to an embodiment.
Figure 22:
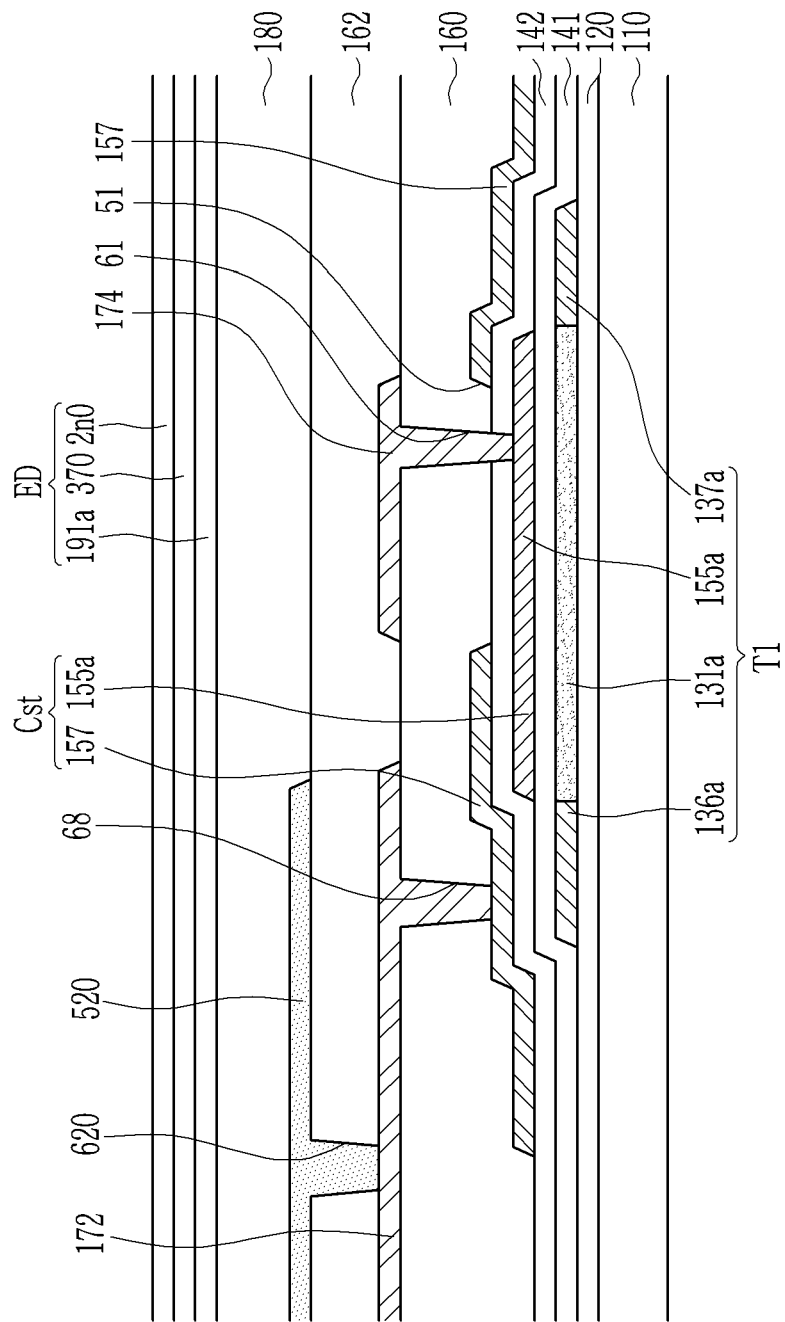
FIG. 22 is a cross-sectional view of FIG. 21, taken along the line X-X'.

Referring to FIG. 21 and FIG. 22, together with FIG. 16 and FIG. 17, a structure of another area of a display device according to an embodiment will be described in further detail.

FIG. 21 is a top plan view of a pixel of a display device according to an embodiment, and FIG. 22 is a cross-sectional view of FIG. 21, taken along the line X-X'. FIG. 21 and FIG. 22 illustrate a pixel located in a main display portion (111 of FIG. 1) of a substrate 110.

A display device according to an embodiment includes a plurality of signal lines 151, 152, 153, 154, 171, and 172 and transistors T1, T2, T3, T4, T5, T6, and T7 disposed on the substrate 110.

The display device according to the present embodiment may further include a driving voltage transmission line 520 transmitting a driving voltage ELVDD. The driving voltage transmission line 520 may be located on the main display portion (111 of FIG. 1) of the substrate 110. The driving voltage transmission line 520 may be located in a fourth conductive layer. The driving voltage transmission line 520 may be located on the same layer as the data voltage transmission line 510.

The driving voltage transmission line 520 may extend mostly in a first direction W1 on a plane. The driving voltage transmission line 520 may extend parallel with a driving voltage line 172.

The driving voltage transmission line 520 may overlap the driving voltage line 172. The driving voltage transmission line 520 is located in a layer that is different from that of the driving voltage line 172. The driving voltage transmission line 520 may be located on a fourth insulation layer 162. A contact hole 620 that is located on the driving voltage line 172 may be formed in the fourth insulation layer 162. The driving voltage transmission line 520 is connected with the driving voltage line 172 through the contact hole 620 and thus transmits the driving voltage ELVDD. The driving voltage transmission line 520 may reduce resistance of the driving voltage line 172 by being connected with the driving voltage line 172.

While this inventive concept has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
a substrate that includes a main display portion, edge portions connected with the main display portion, and a second side portion connected with the main display portion;
a driver connected to the second side portion and including a driving circuit portion and a bending portion that is disposed between the driving circuit portion and the main display portion;
scan lines that are disposed on the substrate;
data lines 1 to n (n is a positive integer) and data lines n+1 to 2n that are disposed in an edge portion and the main display portion, respectively, on the substrate in a sequential order 1, 2, n−1, n, n+1, n+2, 2n−1, 2n;
pixels that are connected with the scan lines and the data lines 1 to 2n; and
data voltage transmission lines in a sequential order of 1, 2, n−1, n connected to the data lines 1, 2, n−1, n, respectively, in the edge portion,
wherein the data lines connect to the driving circuit portion in the sequential order of 1, 2, n−1, n, n+1, n+2, 2n−1, 2n, corresponding respectively to the data lines in the sequential order 1, 2, n−1, n, n+1, n+2, 2n−1, 2n disposed in the edge portion and the main display portion,
wherein the data voltage transmission lines in the sequential order 1, 2, n−1, n run planarly from the edge portion to the main display portion, and
wherein the data voltage transmission lines 1 to n and the data lines n+1 to 2n are arranged in a sequential order of data line n+1, data voltage transmission line n, data line n+1, data voltage transmission line n−1, data line 2n−1, data voltage transmission line 2, data line 2n, and data voltage transmission line 1 in the main display portion adjacent to the bending portion.

2. The display device of claim 1, comprising a second side portion that is bent from the main display portion,
wherein the driver is connected with the second side portion.

3. The display device of claim 1, wherein
the main display portion comprises a first conductive layer, a second conductive layer, a third conductive layer, and a fourth conductive layer that are insulated from each other,
some of the data lines include first connection wires and others of the data lines include second connection wires, and
each of the first, second, third, and fourth conductive layers comprise a connection wire selected from the first connection wires and the second connection wires.

4. The display device of claim 1, wherein the data lines further include connection lines that re-arrange the data lines from the sequential order n+1, n, n+2, n−1, 2n−1, 2, 2n, 1 to the sequential order 1, 2, n−1, n, n+1, n+2, 2n−1, 2n connected to the driving circuit portion.

* * * * *